United States Patent
Nakasugi et al.

(10) Patent No.: US 7,459,705 B2
(45) Date of Patent: Dec. 2, 2008

(54) CHARGED PARTICLE BEAM EXPOSURE METHOD OF CHARACTER PROJECTION SYSTEM, CHARGED PARTICLE BEAM EXPOSURE DEVICE OF CHARACTER PROJECTION SYSTEM, PROGRAM FOR USE IN CHARGED PARTICLE BEAM EXPOSURE DEVICE, AND MANUFACTURING METHOD OF SEMICONDUCTOR DEVICE

(75) Inventors: Tetsuro Nakasugi, Yokohama (JP); Ryoichi Inanami, Yokohama (JP); Takumi Ota, Yokohama (JP); Takeshi Koshiba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 11/583,114

(22) Filed: Oct. 19, 2006

(65) Prior Publication Data

US 2007/0114463 A1 May 24, 2007

(30) Foreign Application Priority Data

Oct. 21, 2005 (JP) .............................. 2005-307656

(51) Int. Cl.
G03F 9/00 (2006.01)
G21K 5/10 (2006.01)
H01J 37/20 (2006.01)

(52) U.S. Cl. ......................... 250/492.22; 250/492.23; 250/492.2; 250/492.3; 250/397

(58) Field of Classification Search ............ 250/492.22, 250/492.23, 492.2, 492.3, 397
See application file for complete search history.

(56) References Cited

U.S. PATENT DOCUMENTS 6,674,086 B2   1/2004   Kamada et al.
6,703,629 B2   3/2004   Nakasugi
6,803,589 B2 * 10/2004  Nakasugi ............... 250/492.22

(Continued)

FOREIGN PATENT DOCUMENTS

JP          2004-281508          10/2004

OTHER PUBLICATIONS

Inanami, R. et al., "Electron Beam Writing Method, Electron Beam Writing Apparatus and Semiconductor Device Manufacturing Method," U.S. Appl. No. 11/409,987, filed Apr. 25, 2006.

*Primary Examiner*—Nikita Wells
(74) *Attorney, Agent, or Firm*—Finnegan, Henderson, Farabow, Garrett & Dunner, L.L.P.

(57) ABSTRACT

A charged particle beam exposure method is disclosed, which includes preparing an aperture mask having character apertures, correcting dimensions of designed patterns in design data in consideration of at least one of factors such as a forward scattering distance of a charged particle, a rearward scattering distance of the charged particle, a blurring of a beam of the charged particle, a dimension conversion difference of the designed patterns due to a denseness/coarseness difference of the designed patterns caused when the underlayer is processed while using the resist as a mask, and the like, allocating at least a part of a specified character aperture of the plurality of character apertures of the aperture mask to the corrected designed patterns to produce writing data, and exposing the resist to the beams of the charged particle passed through the at least a part of the specified character aperture based on the writing data.

16 Claims, 21 Drawing Sheets

U.S. PATENT DOCUMENTS 6,897,454 B2    5/2005  Sasaki et al.
7,002,167 B2    2/2006  Ogasawara
7,011,915 B2 *  3/2006  Nakasugi ..................... 430/30
2005/0214958 A1 9/2005  Nakasuji et al.

* cited by examiner 121a to 121c, 122a to 122c, 123a to 123c : Designed patterns 131a to 131c, 132a to 132c, 133a to 133c : Resist patterns

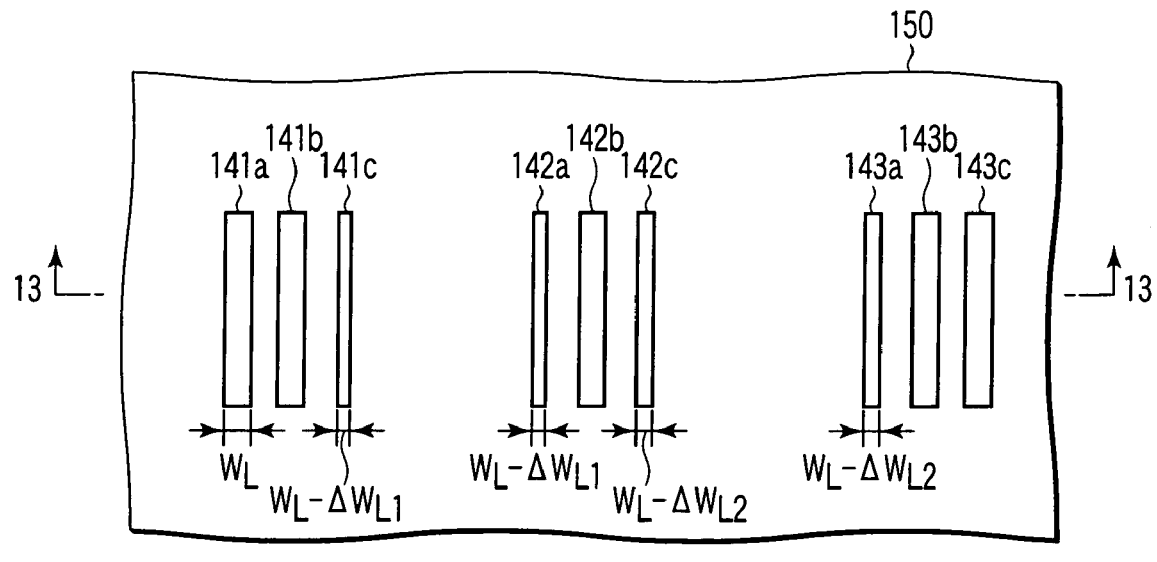
141a to 141c, 142a to 142c, 143a to 143c : Wiring film patterns
F I G. 12
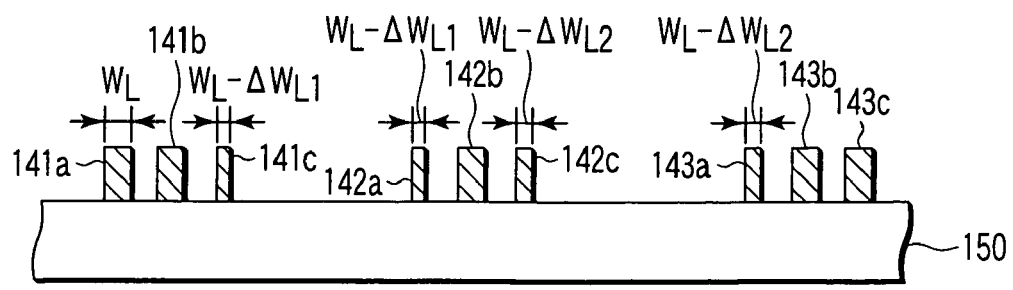
F I G. 13

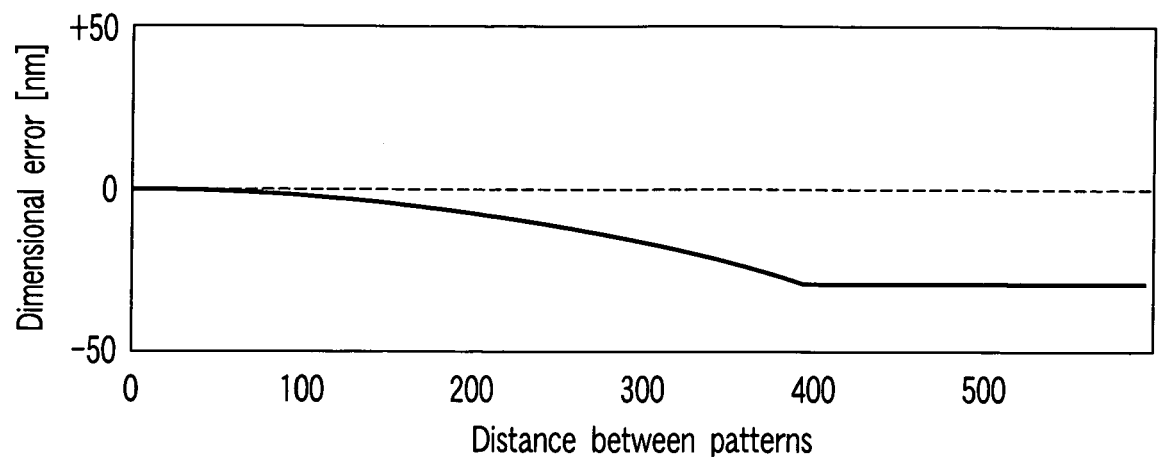
F I G. 14
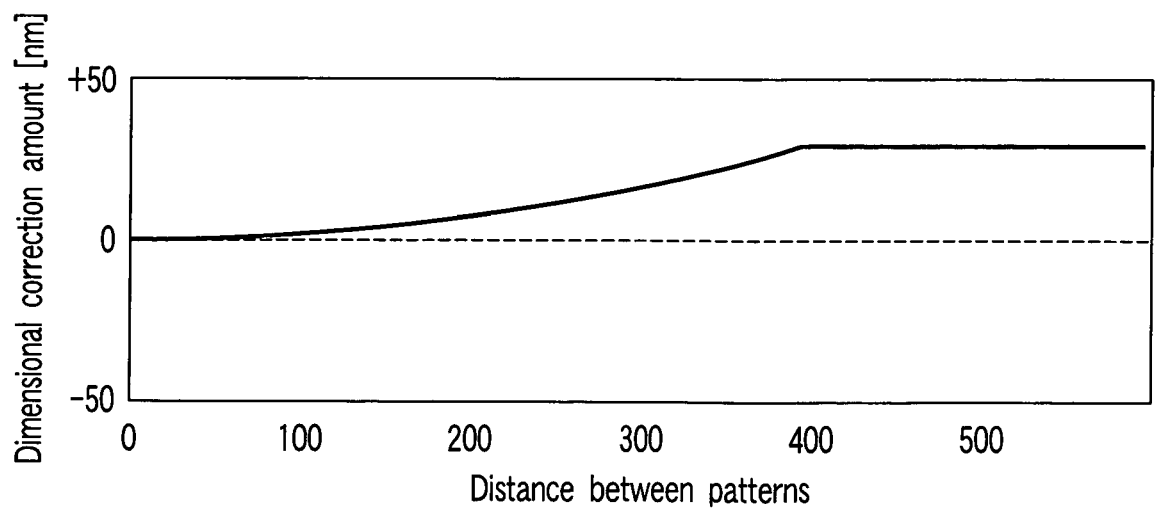
F I G. 15

59a to 59f:
Opening patterns

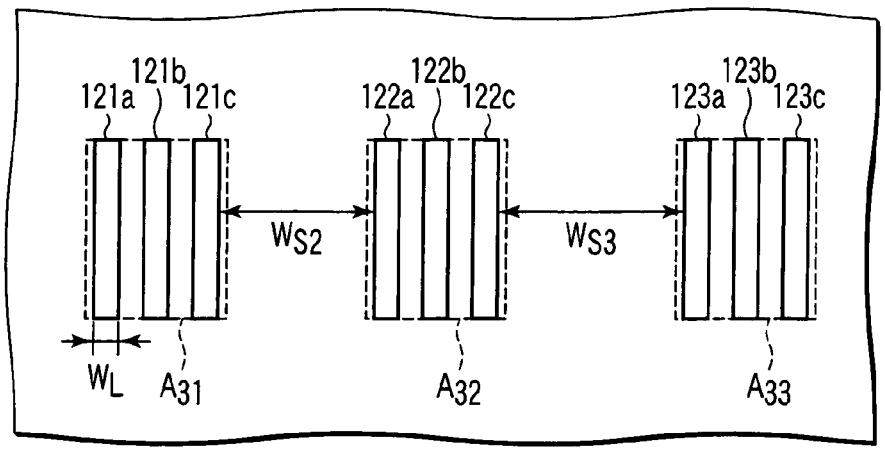
F I G. 34
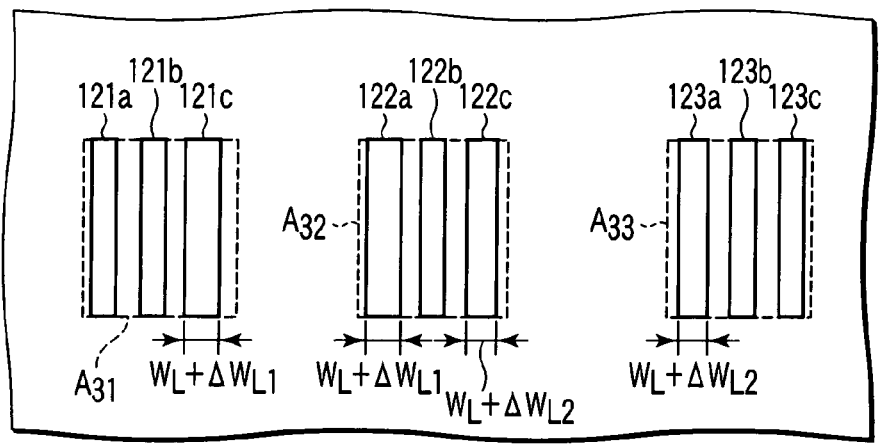
F I G. 35
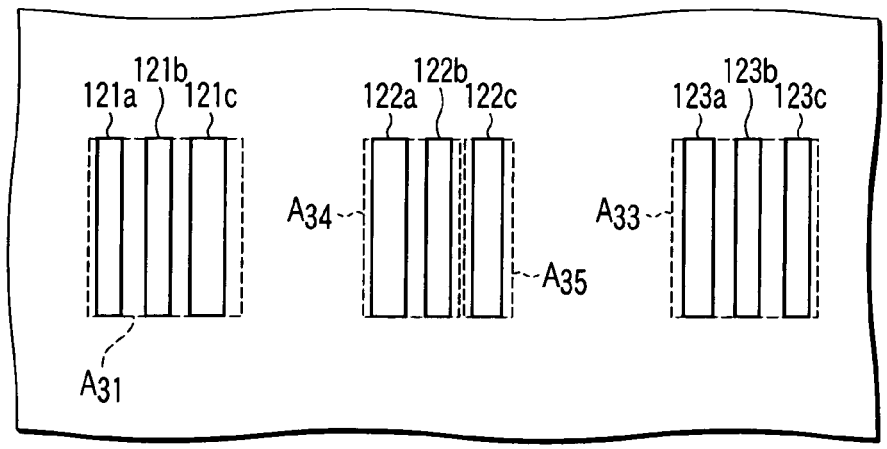
F I G. 36

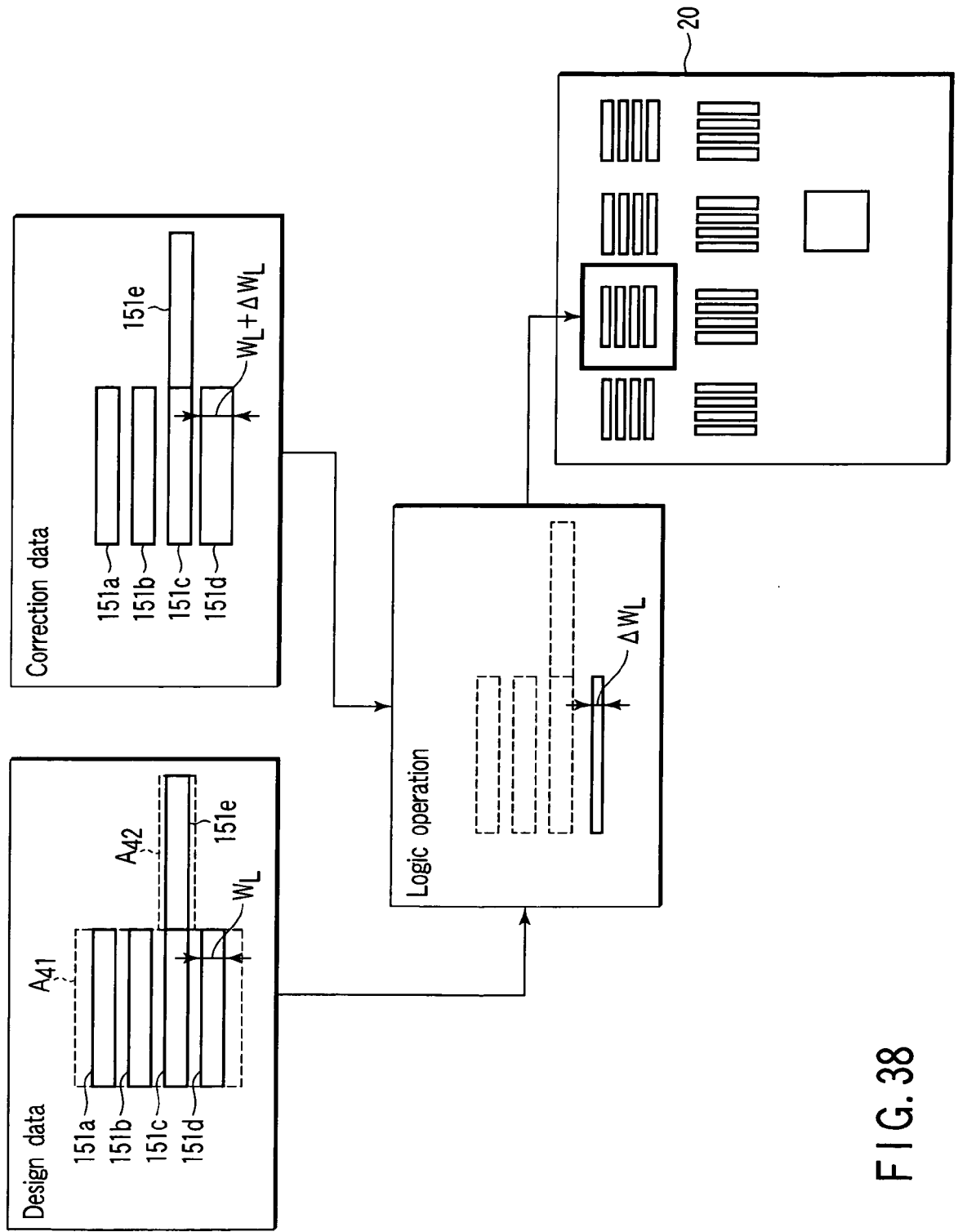
F I G. 38

CHARGED PARTICLE BEAM EXPOSURE METHOD OF CHARACTER PROJECTION SYSTEM, CHARGED PARTICLE BEAM EXPOSURE DEVICE OF CHARACTER PROJECTION SYSTEM, PROGRAM FOR USE IN CHARGED PARTICLE BEAM EXPOSURE DEVICE, AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2005-307656, filed Oct. 21, 2005, the entire contents of which are incorporated herein by reference.

BACKGROUND OF THE INVENTION

1. Field of the Invention

The present invention relates to a charged particle beam exposure technology, and more particularly, a charged particle beam exposure method of a character projection (CP) system, a charged particle beam exposure device of the CP system, a program for use in the charged particle beam exposure device, and a manufacturing method of a semiconductor device.

2. Description of the Related Art

At present, in electron beam exposure, a variably shaped beam (VSB) system is prevalent in which an electron beam is formed into a rectangular shape by use of two aperture masks, and the rectangular electron beam is transferred onto a target object. In recent years, there has been investigated a character projection (CP) system in which in order to improve a throughput of the electron beam exposure, a large number of opening patterns corresponding to a large number of wiring patterns to be provided in an LSI are beforehand formed in a CP aperture mask, and the large number of opening patterns are subjected to a collective exposure. In this way, when a large number of opening patterns are provided in a CP aperture mask, the throughput of an electron beam exposure device is enhanced. For example, there is known a method in which a charged beam is selectively applied onto a CP aperture mask in which periodically arranged opening patterns having a predetermined shape are formed, to thereby simultaneously transfer some of the large number of opening patterns onto the target object, (e.g., see Jpn. Pat. Appln. KOKAI Publication No. 2004-281508).

However, as the wiring patterns are miniaturized, there increases an influence of a dimensional conversion difference on the wiring patterns due to a denseness/coarseness difference of the resist patterns in an etching step of a semiconductor wafer, which leads to a problem that precision of the electron beam exposure deteriorates. That is, even if the resist pattern can be formed with a dimension faithful to the designed pattern by an electron beam exposure, the denseness/coarseness difference of the resist patterns causes a dimensional difference in the patterns to be formed in an underlayer of the resist pattern, when the underlayer is subjected to an etching process following the patterning of the resist film, with the result that the precision of the electron beam exposure deteriorates.

BRIEF SUMMARY OF THE INVENTION

According to a first aspect of the present invention, there is provided a charged particle beam exposure method of a character projection system, comprising:

preparing an aperture mask having a plurality of character apertures;

correcting dimensions of designed patterns in design data in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;

allocating at least a part of a specified character aperture of the plurality of character apertures of the aperture mask to the corrected designed patterns to produce writing data; and exposing the resist to the beams of the charged particle passed through the at least a part of the specified character aperture based on the writing data.

According to a second aspect of the present invention, there is provided a charged particle beam exposure device of a character projection system comprising:

a stage on which a substrate is to be mounted;

a driving mechanism which drives an aperture mask having a plurality of character apertures;

a beam generation source of charged particles which applies beams of the charged particles to the substrate via the aperture mask;

a correction section which corrects dimensions of designed patterns of design data in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;

a writing data producing section which allocates at least a part of a specified character aperture of the plurality of character apertures of the aperture mask to the corrected designed patterns to produce writing data; and an exposure section which exposes the resist to the beams of the charged particle passed through the at least a part of the specified character aperture based on the writing data.

According to a third aspect of the present invention, there is provided a program for use in a charged particle beam exposure device on which an aperture mask having a plurality of character apertures is mounted, the program allowing a computer to execute:

an instruction to correct dimensions of designed patterns in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;

an instruction to allocate at least a part of a specified character aperture of the plurality of character apertures of the aperture mask to the corrected designed patterns to produce writing data; and an instruction to expose the resist to the beams of the charged particle passed through the at least a part of the specified character aperture based on the writing data.

According to a fourth aspect of the present invention, there is provided a manufacturing method of a semiconductor device in which a charged particle beam exposure method of a character projection system is used in manufacturing steps of the semiconductor device, the charged particle beam exposure method comprising:

preparing an aperture mask having a plurality of character apertures each having a plurality of opening patterns;

correcting dimensions of designed patterns of design data in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;

allocating at least a part of a plurality of opening patterns of a specified character aperture specified from the plurality of character apertures to those of the plurality of designed patterns which are in a shot region including at least a designed pattern having a dimension changed by the correction to produce writing data; and exposing the resist to the beams of the charged particle passed through the at least a part of the opening patterns of the specified character aperture based on the writing data.

BRIEF DESCRIPTION OF THE SEVERAL VIEWS OF THE DRAWING

FIG. 12 is a plan view showing the film in a following step for the sake of the explanation of the dimensional error according to the embodiment the present invention;

FIG. 13 is a cross sectional view of the film of FIG. 12 taken along the line 13-13 thereof for the sake of the explanation of the dimensional error according to the embodiment of the present invention;

FIG. 14 is a table showing a relation between a distance between patterns and a dimensional error according to the embodiment of the present invention;

FIG. 15 is a table showing a relation between a distance between patterns and a dimensional correction amount according to the embodiment of the present invention;

FIG. 34 is a schematic diagram of a design data after a division processing for the sake of the explanation of an example of the electron beam exposure method according to the first modification of the embodiment of the present invention;

FIG. 35 is a schematic diagram of the design data after a dimensional correction processing for the sake of the explanation of the example of the electron beam exposure method in the first modification of the embodiment of the present invention;

FIG. 36 is a schematic diagram of the design data after a dimensional correction processing in which different opening patterns from those in FIG. 35 are applied, for the sake of the explanation of the example of the electron beam exposure method in the first modification of the embodiment of the present invention;

FIG. 38 is a schematic diagram for the sake of the explanation of the example of the electron beam exposure method in the second modification of the embodiment of the present invention.

DETAILED DESCRIPTION OF THE INVENTION

Figure 1:
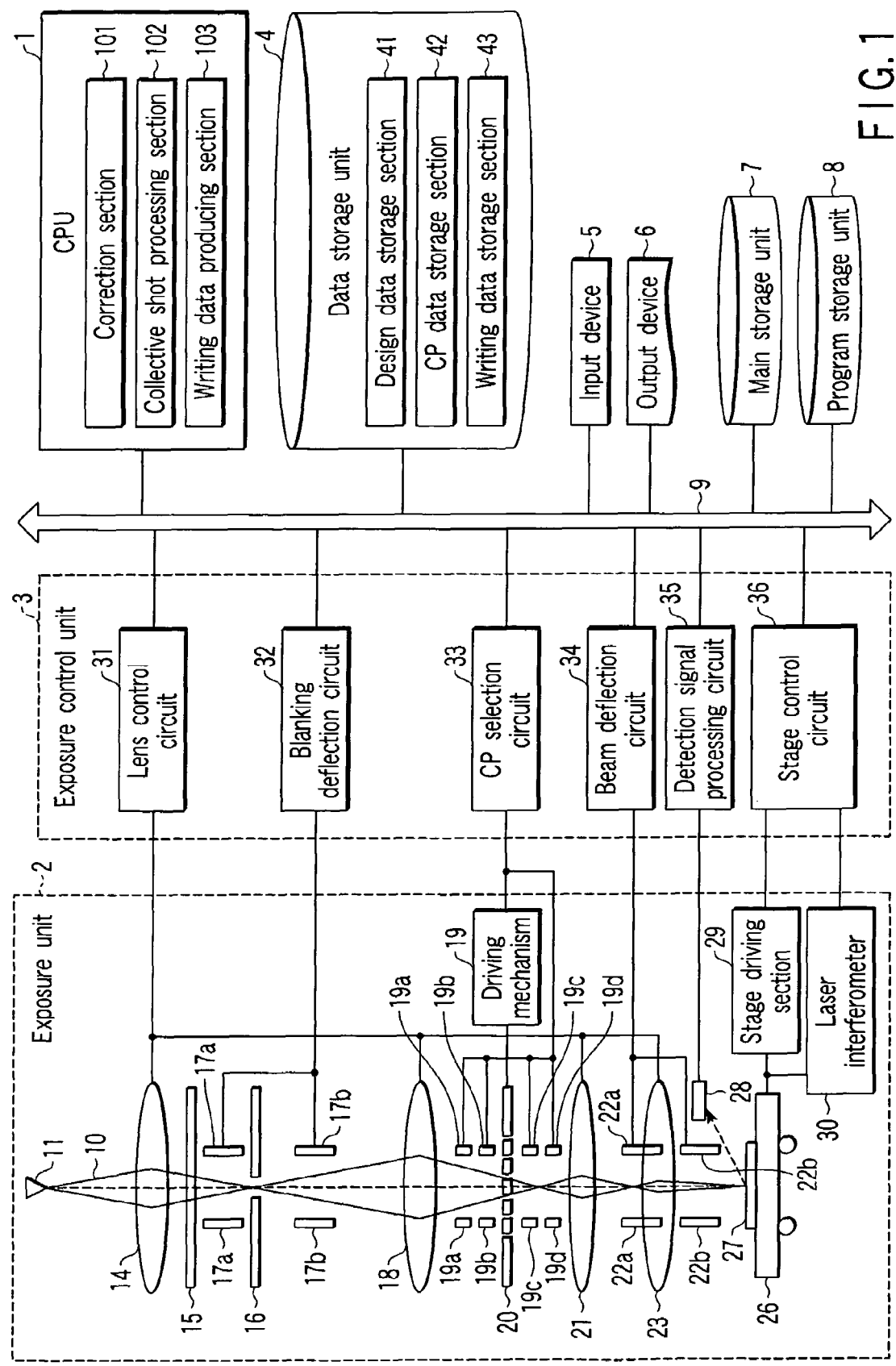
FIG. 1 is a block diagram of an example of an electron beam exposure device according to an embodiment of the present invention.

An embodiment of the present invention will be described with reference to the drawings. In the following description of the drawings, the same or similar components are denoted with the same or similar reference numerals.

Moreover, according to the embodiment of the present invention, an electron beam will be described as an example of a beam of charged particles, however, an ion beam may be employed as the beam of the charged particles. That is, the following description can apply to the ion beam in the same manner as in the electron beam.

As shown in FIG. 1, an electron beam exposure device according to the embodiment of the present invention comprises a central processing unit (CPU) 1, a writing unit 2, a writing control unit 3, a data storage unit 4, an input device 5, an output device 6, a main storage unit 7 and a program storage unit 8. The CPU 1, the writing control unit 3, the data storage unit 4, the input device 5, the output device 6, the main storage unit 7 and the program storage unit 8 are connected to one from another via a bus 9.

An electronic optical system of the writing unit 2 comprises an electron beam generation source (electron gun) 11, a condenser lens 14, a first shaping aperture mask 15, a second shaping aperture mask (CP aperture mask) 20, a blanking aperture mask 16, blanking deflectors 17a, 17b, a projection lens 18, CP selecting deflectors 19a, 19b, 19c, 19d, a reduction lens 21, an objective lens 23, objective deflectors 22a, 22b, and a driving mechanism 19. Further, a stage 26 for mounting an object 27, and a detector 28 such as the Faraday cup which detects a secondary electron, a reflected electron, and the like from the object 27, are provided in an object chamber.

The electron gun 11 generates and emits an electron beam 10. The condenser lens 14 adjusts illumination of the electron beam 10. The first shaping aperture mask 15 and the CP aperture mask 20 form the electron beam 10 into a desired shape. The blanking aperture mask 16 turns on or off the electron beam 10. The blanking deflectors 17a and 17b deflect the electron beam 10 onto the blanking aperture mask 16. The projection lens 18 forms an image on the CP aperture mask 20.

The CP selecting deflectors 19a to 19d deflect the electron beam 10 to position the electron beam 10 in a desired CP position on the CP aperture mask 20, whereby a desired CP aperture formed in the CP aperture mask 20 is selected. In consequence, a degree of optical overlap between the first shaping aperture mask 15 and the CP aperture mask 20 is controlled to form the electron beam 10 into the desired shape.

The objective deflectors 22a and 22b deflect the electron beam 10 formed into the desired shape to thereby scan the object 27 with the electron beam 10. In this embodiment, an acceleration voltage is 5 keV, and sizes of deflection regions of the objective deflectors 22a and 22b are 1.5 mm and 50 μm.

Since the CP selecting deflectors 19a to 19d and the objective deflectors 22a and 22b are required to precisely deflect the electron beam 10 at a high speed, electrostatic deflectors are used. To deflect the electron beam 10 with a high precision without deteriorating the throughput, the objective deflectors 22a and 22b have a plurality of deflecting electrodes for minimizing deflection aberrations in addition to a main deflector and a sub-deflector.

The reduction lens 21 and the objective lens 23 cause the electron beam 10 to form an image on the object 27. As the object 27, a semiconductor substrate of silicon (Si) or the like coated with a resist may be used in a case where a semiconductor device is manufactured by a direct writing system, and a glass substrate or the like coated with the resist may be used in a case where a mask for exposure is manufactured by the direct writing system. Also, as the object 27, the glass substrate or the like may be used in a case where a liquid crystal display device is manufactured by the direct writing system, and a resin substrate of polycarbonate or the like may be used in a case where an optical recording medium is manufactured by the direct writing system. Needless to say, various thin films can be formed on the glass substrate or the resin substrate in the progress of steps.

The stage 26 is movable in an X-direction and a Y-direction (horizontal plane). A laser interferometer 30 measures a position of the stage 26. A stage driving section 29 moves the stage 26 in the X-direction and the Y-direction based on the position of the stage 26 measured by the laser interferometer 30.

During electron beam exposure, the electron beam 10 generated from the electron gun 11 is adjusted into a desired current density by the condenser lens 14, and the adjusted beam is uniformly applied to the first shaping aperture mask 15. The electron beam 10 passed through a rectangular aperture of the first shaping aperture mask 15 forms the image on the CP aperture mask 20 by the projection lens 18. The image defined by an optical overlap between the first shaping aperture mask 15 and the CP aperture mask 20 is reduced at a predetermined reduction ratio by the reduction lens 21. Subsequently, the image is formed on the object 27 by the objective lens 23. At this time, the objective deflectors 22a and 22b form an electric field in accordance with a deflection voltage applied by a beam deflection circuit 34 to thereby deflect the electron beam 10. When the object 27 is moved, it is necessary to prevent the object 27 from being unnecessarily exposed. For the prevention, the electron beam 10 is deflected onto the blanking aperture mask 16 by the blanking deflectors 17a and 17b to turn off the electron beam 10, whereby the beam does not reach the surface of the object 27 any more.

The writing control unit 3 has a lens control circuit 31, a blanking deflection circuit 32, a CP selection circuit 33, the beam deflection circuit 34, a detection signal processing circuit 35 and a stage control circuit 36. The lens control circuit 31 applies a voltage for adjusting the illumination conditions of the electron beam 10 to the condenser lens 14. The blanking deflection circuit 32 applies a deflection voltage for turning on or off the electron beam 10 to the blanking deflectors 17a and 17b. The CP selection circuit 33 applies a voltage for controlling a degree of overlap of the electron beam 10 to the CP selecting deflectors 19a to 19d. The beam deflection circuit 34 applies the deflection voltage for deflecting the electron beam 10 to the objective deflectors 22a and 22b. The detection signal processing circuit 35 converts the secondary electron or the like detected by the detector 28 into a signal, and transmits the detection signal to the CPU 1. The stage control circuit 36 is connected to the stage driving section 29 and the laser interferometer 30. While referring to a coordinate position of the stage 26 measured by the laser interferometer 30, the stage control circuit 36 drives the stage driving section 29 to control the position of the stage 26.

Figure 2:
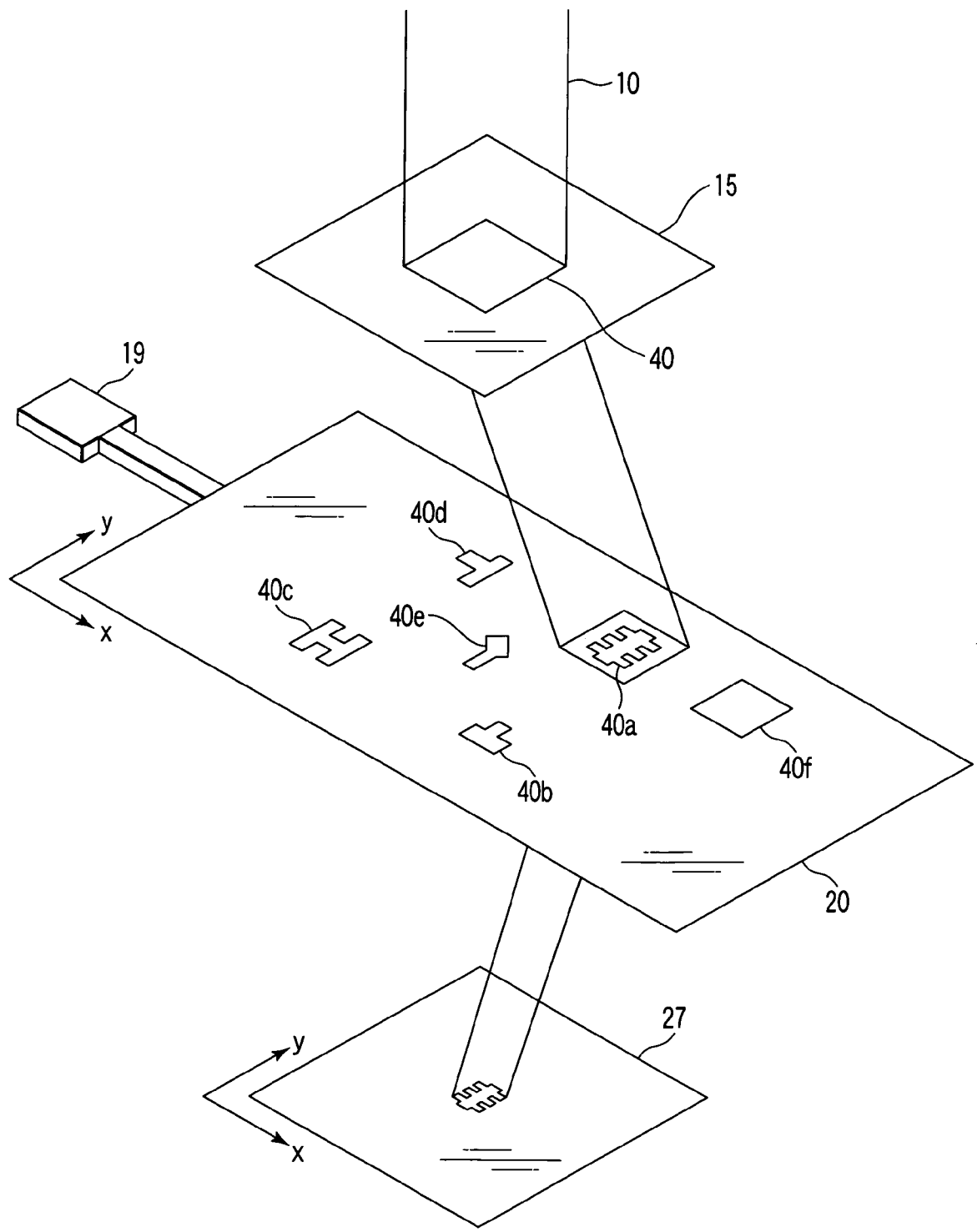
FIG. 2 is a schematic diagram showing examples of first and second shaping aperture masks.

Examples of the first shaping aperture mask 15 and the CP aperture mask 20 will be described with reference to FIG. 2. The first shaping aperture mask 15 is provided with a rectangular aperture 40. In the CP aperture mask 20, there are formed a plurality of openings for CP (character apertures) 40a to 40e having a high repeatability for use in a CP system, and an opening 40f for VSB which is used in a VSB system. Character apertures can be provided for a plurality of layers in one CP aperture mask 20, and the apertures can be selected. A reduction ratio of the character apertures 40a to 40e and the VSB opening 40f by the reduction lens 21, objective lens 23, and the like is, for example, 1/5. In the following description, the reduction ratio of 1/5 will be employed.

The electron beam 10 is positioned in a desired CP position on the CP aperture mask 20 by the CP selecting deflectors 19a to 19d to thereby form the electron beam 10 into a shape of a targeted character aperture (e.g., the character aperture 40a), and the formed electron beam (character beam) 10 is applied to a desired position on the object 27 by the objective deflectors 22a and 22b, whereby an LSI pattern can be written on the object 27 at a high speed. For example, the character aperture 40e forms the electron beam (character beam) 10 having a rectangular or triangular shape by superimposing the electron beam 10 on the rectangular aperture 40 of the first shaping aperture mask 15.

The CP aperture mask 20 is provided with the driving mechanism 19. The driving mechanism 19 moves the CP aperture mask 20 to selectively draw the character apertures 40a to 40e and the opening 40f for VSB. As the driving mechanism 19, there can be used an ultrasonic stage driving section, a piezoelectric element, an electromotive stage driving section, a manual driving mechanism or the like.

Here, a method of controlling the electron beam 10 by the CP selecting deflectors 19a to 19d will be described. During the writing, the CP selection circuit 33 shown in FIG. 1 determines a flag (VSB/CP flag) for selecting the VSB system or the CP system from shot information including a beam size, an aperture to be used, a beam position, the VSB/CP flag, and the like sent from the CPU 1, and switches the CP selecting deflectors 19a to 19d to be used.

Figure 3:
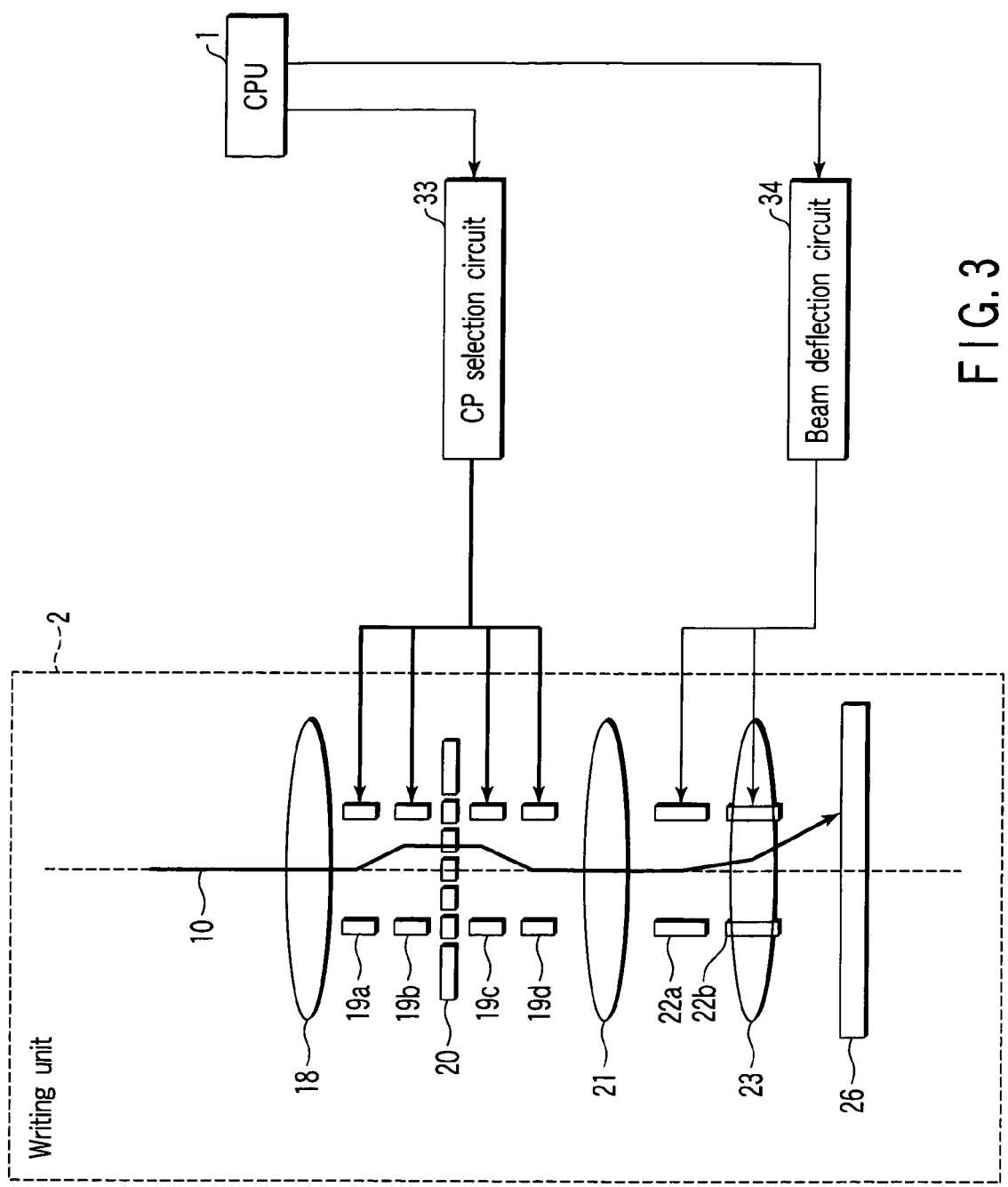
FIG. 3 is a schematic block diagram explaining a character projection (CP) system according to the embodiment of the present invention.

In the CP system, as shown in FIG. 3, for example, four stages of the CP selecting deflectors 19a to 19d are used. The CP selecting deflector 19a deflects the electron beam 10 coming along an optical axis from an upstream side in a direction of a desired CP. The deflected electron beam 10 is re-deflected by the CP selecting deflector 19b so as to be directed in a direction perpendicular to the CP aperture mask 20. As a result, the electron beam 10 perpendicularly enters the character apertures 40a to 40e of the CP aperture mask 20. The electron beam 10 perpendicularly passed through the character apertures 40a to 40e of the CP aperture mask 20 is deflected in an optical axis direction by the CP selecting deflector 19c, and is then again deflected by the CP selecting deflector 19d so as to be directed in the perpendicular direction along the optical axis. As a result, even when the electron beam 10 passes through any of the character apertures 40a to 40e of the CP aperture mask 20, the beam is directed back on the optical axis, and enters the reduction lens 21, the objective lens 23 and the objective deflectors 22a and 22b on a downstream side in parallel with the optical axis. That is, even when the electron beam 10 passes through any of the character apertures 40a to 40e in the CP aperture mask 20, the beam is directed back onto the optical axis by the CP selecting deflectors 19a to 19d. Therefore, even when the electron beam 10 is largely deflected on the CP aperture mask 20, there is little deviation of an incident position of the electron beam 10 on the object 27, so that the writing can be performed with a high precision. A voltage of each of the deflectors 19a to 19d is ±40V. In this case, a deflection width is 1 mm on each of the character apertures 40a to 40e.

Figure 4:
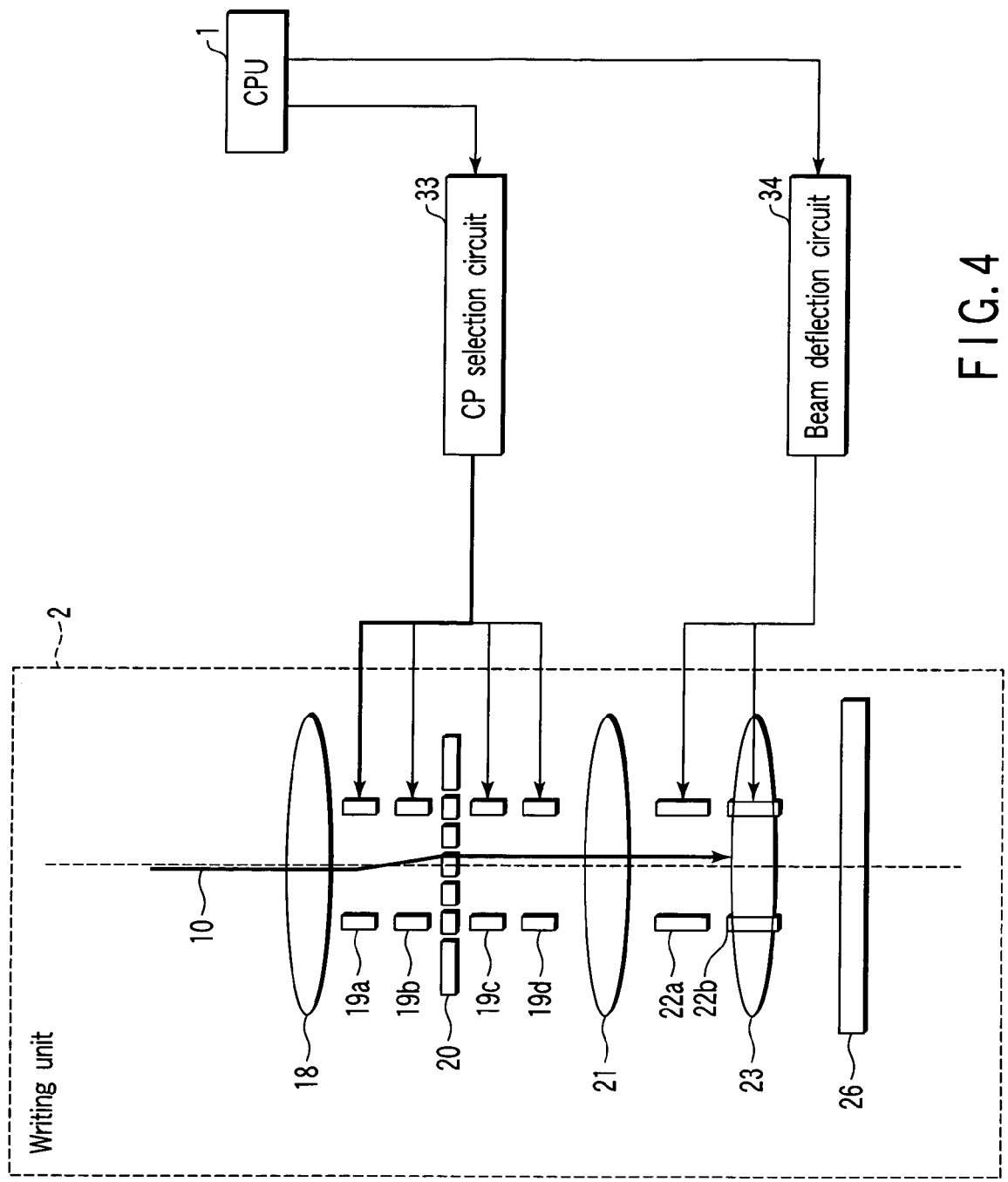
FIG. 4 is a schematic block diagram explaining a VSB system according to the embodiment of the present invention.

On the other hand, in the VSB system, as shown in FIG. 4, the CP selecting deflector 19a, for example, is used alone. In the case of the VSB system, when the VSB opening 40f to be used is provided in the vicinity of the optical axis, the deflection width can be excessively small as compared with the CP system. 100 μm of beam deflection width on the VSB opening 40f suffices for the VSB system. As understood from the above, since the beam deflection width required for the VSB system is small, it is unnecessary to re-direct the electron beam 10 on the optical axis as in the CP system. When voltages for beam alignment are superimposed on the CP selecting deflectors 19c and 19d, the voltages of the CP selecting deflectors 19c and 19d are output. When a correction voltage for beam alignment is superimposed on a positioning deflector, any voltages do not have to be superimposed on the CP selecting deflectors 19c and 19d. As described above, the CP system and the VSB system can be switched to each other to select a large number of character apertures 40a to 40e and the VSB opening 40f.

There will be described wiring patterns of a logic device represented by an integrated circuit (ASIC) for a specific use application. As characteristics of the wiring patterns of the logic device, the followings are prescribed: (a) widths of the wiring patterns are equal to each other except for a power supply wiring pattern; (b) sizes of via-hole patterns (contact hole patterns) are equal to each other; (c) the wiring patterns and the via-hole patterns are provided on grids of a constant interval; and (d) a preferred direction of the wiring patterns is determined for each layer. The above characteristics are referred to during layout of the patterns, and determined in accordance with a design rule in many cases. Some exceptions are present, however, the number of the exceptions is small.

Figure 5:
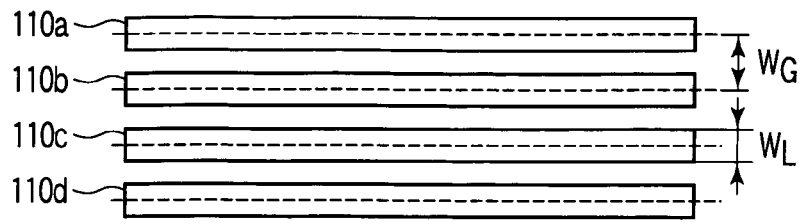
FIG. 5 is a plan view showing an example of a wiring pattern of a lower layer according to the embodiment of the present invention.
Figure 6:
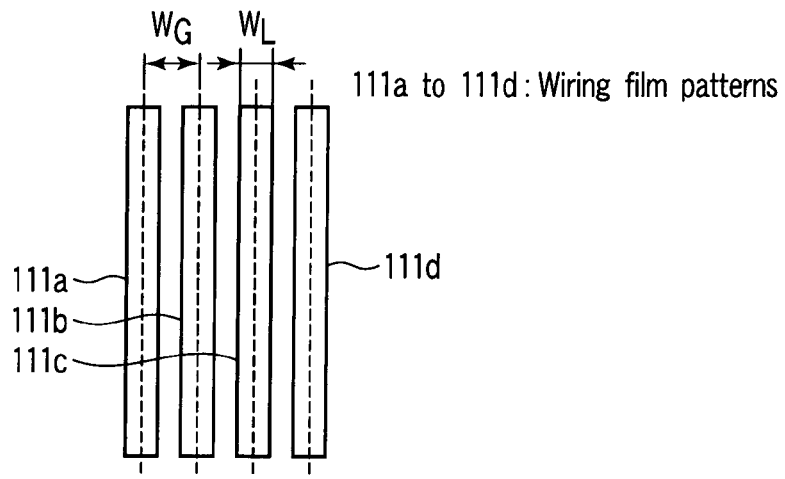
FIG. 6 is a plan view showing an example of a wiring pattern of an upper layer according to the embodiment of the present invention.
Figure 7:
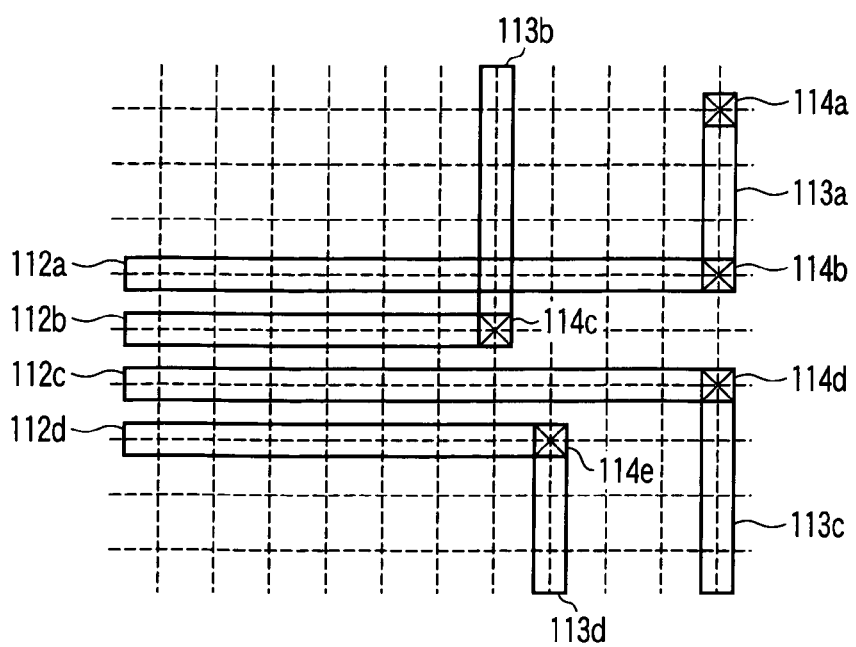
FIG. 7 is a plan view showing an example of wiring patterns of lower and upper layers according to the embodiment of the present invention.

FIGS. 5 to 7 show examples of the wiring patterns. FIG. 5 shows wiring patterns 110a to 110d of a first wiring layer. A width $W_L$ of each of the wiring patterns 110a to 110d is beforehand determined. The wiring patterns 110a to 110d are arranged on grids of an interval $W_G$ (=$W_L$×2). Therefore, an interval between the adjacent those of the wiring patterns 110a to 110d is ($W_G$−$W_L$) at minimum. Among the wiring patterns 110a to 110d, the densest arrangement portion is a line and space (L/S) pattern having a ratio of 1:1. FIG. 6 shows wiring patterns 111a to 111d of a second wiring layer which is a one-layer upper layer of the first wiring layer. There is a basic direction of the wiring patterns in each layer, and the wiring patterns 111a to 111d of the second wiring layer are arranged in a direction obtained by rotating, by 90 degrees, a direction of the wiring patterns 110a to 110d of the first wiring layer shown in FIG. 5.

As shown in FIG. 7, wiring patterns 112a to 112d of a lower wiring layer are connected to wiring patterns 113a to 113d of an upper wiring layer between the upper and lower wiring layers by arranging via-hole patterns 114a to 114e. Arrangement positions of the via-hole patterns 114a to 114e are intersections of the grids of the wiring layers, and intervals between the arrangement positions are equal to each other.

Figure 8:
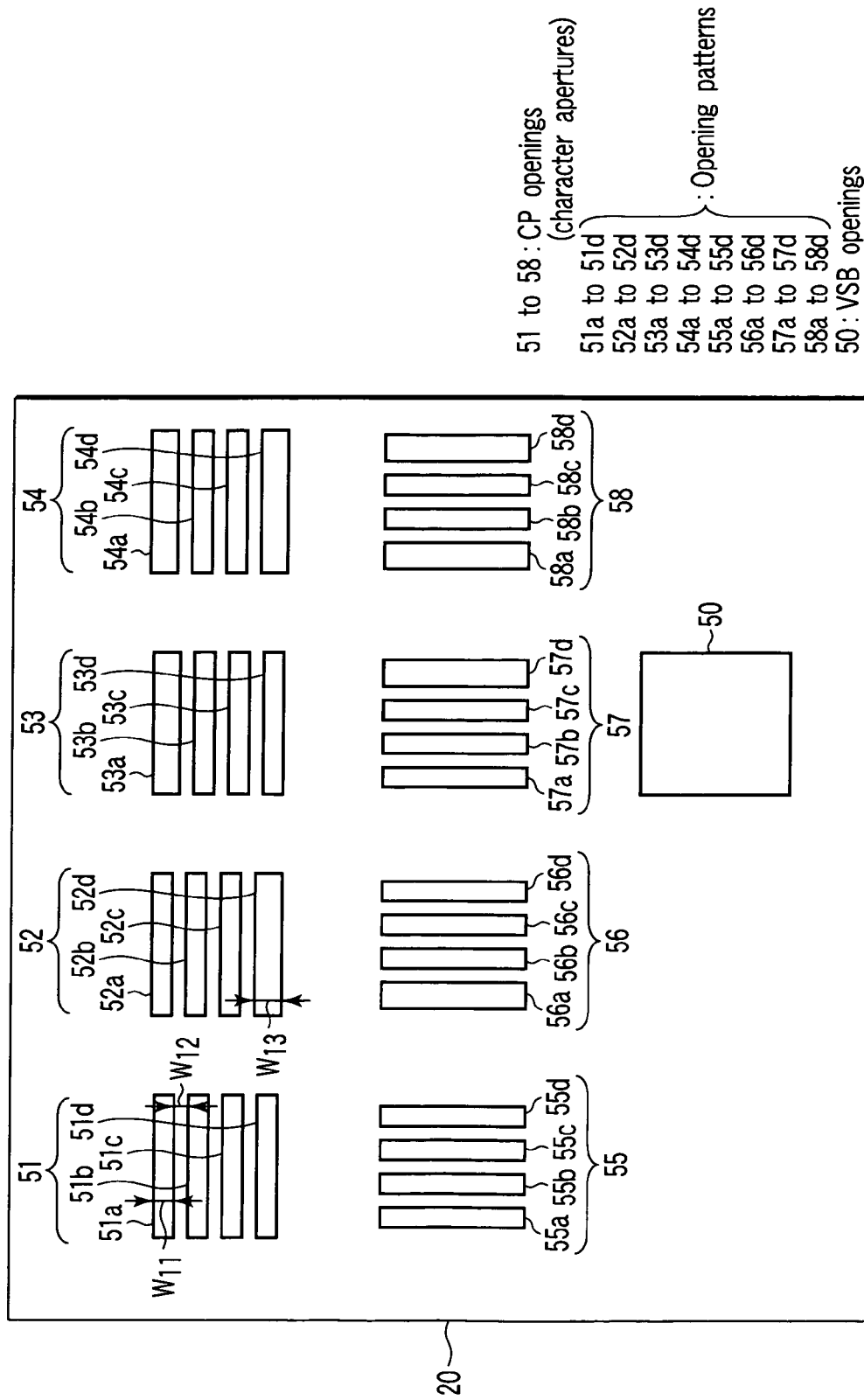
FIG. 8 is a plan view showing an example of a CP aperture mask according to the embodiment of the present invention.

The above characteristics of the wiring patterns are incorporated in the CP aperture mask 20 shown in FIG. 8. In the CP aperture mask 20, an opening 50 for VSB and openings 51 to 58 for CP (character apertures) are formed, as shown in FIG. 8.

The character apertures 51 to 54 are used when exposing the wiring patterns arranged in an X-direction. The character aperture 51 includes opening patterns 51a to 51d arranged apart from one another in a Y-direction and each having a line width $W_{11}$. The character aperture 52 has opening patterns 52a to 52c of the line width $W_{11}$ and an opening pattern 52d of a line width $W_{13}$ larger than the line width $W_{11}$, which are arranged in parallel in the Y-direction. The character aperture 53 has openings patterns 53b to 53d of the line width $W_{11}$ and an opening pattern 53a of the line width $W_{13}$, which are arranged in parallel in the Y-direction. The character aperture 54 has opening patterns 54b, 54c of the line width $W_{11}$ and opening patterns 54a, 54d of the line width $W_{13}$, which are arranged in parallel in the Y-direction.

The character apertures 55 to 58 are used when exposing wiring patterns arranged in the Y-direction. The character aperture 55 includes opening patterns 55a to 55d each having the line width $W_{11}$ and arranged in parallel apart from one another at an interval $W_{12}$ in the X-direction. The character aperture 56 has opening patterns 56b to 56d of the line width $W_{11}$ and an opening pattern 56a of the line width $W_{13}$, which are arranged in parallel in the X-direction. The character aperture 57 has opening patterns 57a to 57c of the line width $W_{11}$ and an opening pattern 57d of the line width $W_{13}$, which are arranged in parallel in the X-direction. The character aperture 58 has opening patterns 58b and 58c of the line width $W_{11}$ and opening patterns 58a and 58d of the line width $W_{13}$, which are arranged in parallel in the X-direction.

Since the character apertures 51 to 58 are openings used when forming the wiring patterns, the character apertures 51 to 58 are provided only in the X and Y-directions. Furthermore, a wiring pitch on the CP aperture mask 20 is determined so as to be equal on the surface of the object to a wiring pitch described in the design data. In the case of this embodiment, the reduction ratio is 1/5 and the wiring pitch on the object surface is 100 nm, and hence the wiring pitch on the CP aperture mask 20 is 500 nm. In FIG. 8, only eight types of character apertures 51 to 58 are described as the character apertures, however, there may be prepared further character apertures in which ratios of the wiring patterns are different from the character apertures 51 to 58. An opening for an oblique wiring and an opening for a contact hole array may be provided in the CP aperture mask 20. In each of the character apertures 51 to 58, only four wiring patterns are shown for simplification, however, each character aperture may be constituted of five or more wiring patterns.

In the electron beam exposure device shown in FIG. 1, the CPU 1 includes a correcting section 101, a collective shot processing section 102 and a writing data generating section 103. The correcting section 101 performs a dimensional correction processing to correct dimensions with respect to a desired design data.

Figure 10:
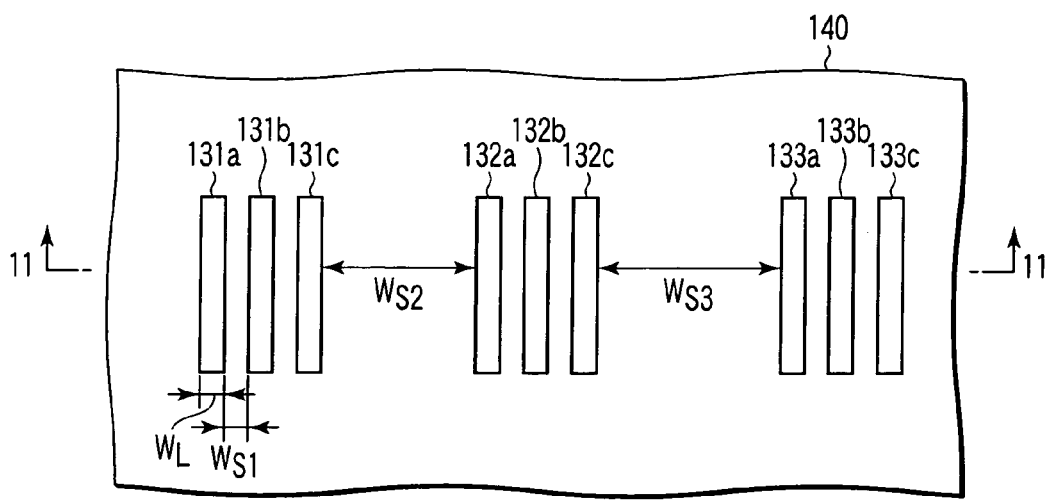
FIG. 10 is a plan view showing a film in a processing step for the sake of the explanation of a dimensional error according to the embodiment of the present invention.
Figure 11:
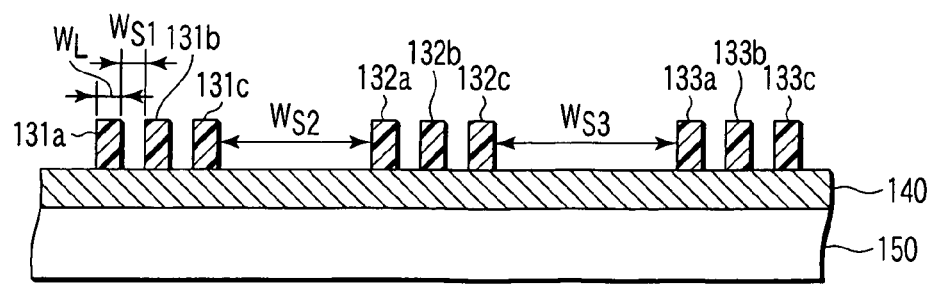
FIG. 11 is a cross sectional view of the film of FIG. 10 taken along the line 11-11 thereof for the sake of the explanation of the dimensional error according to the embodiment of the present invention.

Here, prior to description of the dimensional correction processing, dimensional errors will be described. Writing data is produced based on designed patterns 121a, 121b, 121c, 122a, 122b, 122c, 123a, 123b, and 123c of the design data shown in FIG. 9, and on the basis of the produced writing data, a resist film is exposed to the electron beam, whereby resist patterns 131a, 131b, 131c, 132a, 132b, 132c, 133a, 133b, and 133c each having a desired dimension $W_L$ can be formed as shown in FIGS. 10 and 11. Even in this case, when a film 140 to be processed is etched to form the wiring patterns, dimensional error is caused due to denseness/coarseness difference of the resist patterns. Therefore, as shown in FIGS. 12 and 13, among wiring patterns 141a, 141b, 141c, 142a, 142b, 142c, 143a, 143b, and 143c formed from the film 140 on a substrate 150 (e.g., a semiconductor substrate), the wiring patterns 141c, 142a and the wiring patterns 142c, 143a in which the adjacent wiring patterns are relatively distant from each other are reduced by $\Delta W_{L1}$ and $\Delta W_{L2}$, respectively. It is to be noted that in this embodiment, a denseness/coarseness difference of the designed patterns is described as one cause of the pattern dimensional difference. However, the pattern dimensional differences are sometimes caused by a forward scattering distance of the electrons of the electron beam 10, a rearward scattering distance of the electrons of the electron beam 10, a blurring of the electron beam 10, a distance by which the underlayer, i.e. the object 27 (FIG. 1), provided under the chemical amplification type resist is influenced by a diffusion of an acid in the resist to be exposed to the electron beam.

In the dimensional correction processing, the above dimensional errors are corrected. FIG. 14 shows a relation between a distance between the patterns and the dimensional error, and FIG. 15 shows a table for correction which is used to correct the dimensions error. In the example of FIG. 14, when the distance between the patterns is 0 to 100 nm, the dimensional error is scarcely generated, and therefore a correction amount is substantially zero. When the distance between the patterns is 200 nm to 400 nm, the reductions of the patterns are generated substantially in proportion, and therefore the correction amount increases. Further, when the distance between the patterns is 400 nm or more, the reduction amount is fixed, and therefore the correction amount is also fixed. In this example, when the distance between the patterns is 400 nm or more, the correction amount is +40 nm. The relation between the distance between the patterns and the dimensional error shown in FIG. 14, and the table for correction shown in FIG. 15 may be stored as data for correcting the dimensional error due to the denseness/coarseness difference of the patterns in a design data storage section 41 or the like in the electron beam exposure device shown in FIG. 1.

Figure 9:
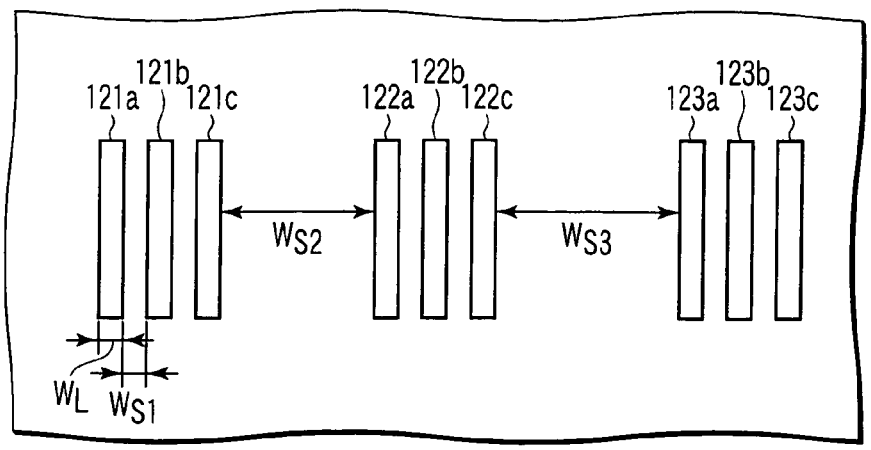
FIG. 9 is a schematic diagram showing an example of a designed pattern according to the embodiment of the present invention.
Figure 16:
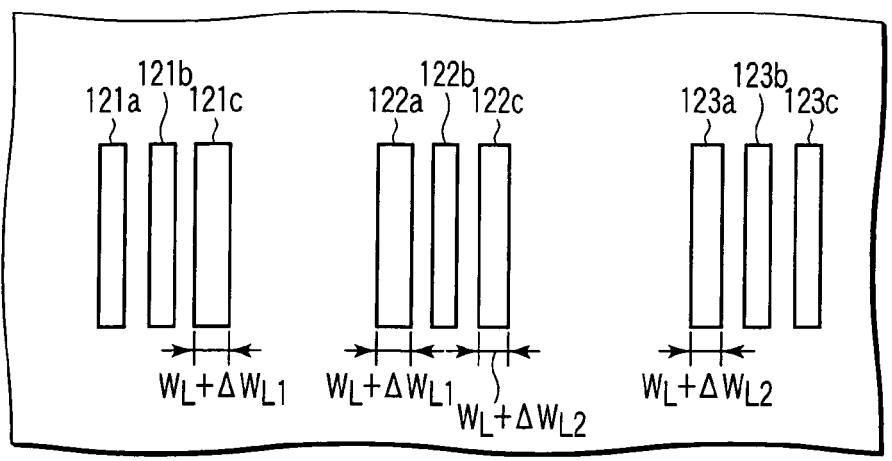
FIG. 16 is a schematic diagram of a designed pattern for the sake of the explanation of a dimensional correction processing according to the embodiment of the present invention.

The correcting section 101 of the CPU 1 calculates distances $W_{S1}$, $W_{S2}$ and $W_{S3}$ between the patterns of the designed patterns 121a, 121b, 121c, 122a, 122b, 122c, 123a, 123b, and 123c of the design data shown in FIG. 9. With reference to the table for correction shown in FIG. 15 and in accordance with the distances $W_{S1}$, $W_{S2}$ and $W_{S3}$ between the patterns, the correcting section 101 corrects (resizes) the designed patterns 121c and 122a and the designed patterns 122c and 123a to widen the designed patterns 121c and 122a and the designed patterns 122c and 123a, by $\Delta W_{L1}$ and $\Delta W_{L2}$, respectively, as shown in FIG. 16, so that correction data is produced. It is to be noted that there is here described the correction in consideration of a dimension conversion difference of the designed patterns due to a denseness/coarseness difference of the designed patterns pattern dimensional differences caused when an etching is carried out. However, the dimensions may be corrected further in consideration of at least one of parameters such as a forward scattering distance of the charged particle, a rearward scattering distance of the charged particle, a blurring of the beam of the charged particle, a distance by which the underlayer provided under the chemical amplification type resist is influenced by a diffusion of an acid in the resist to be exposed to the beam of the charged particle.

Figure 17:
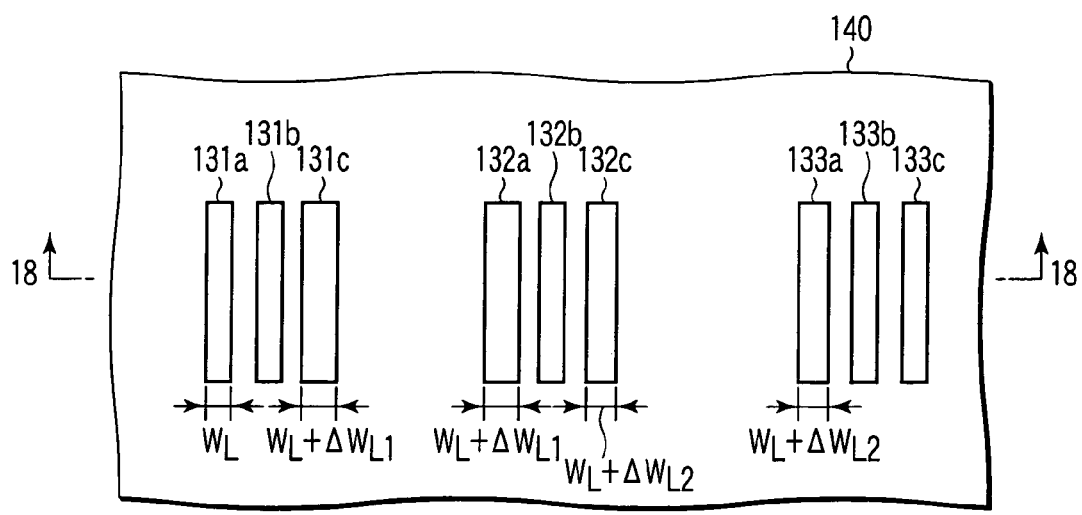
FIG. 17 is a plan view showing a film in a processing step for the sake of the explanation of the dimensional correction processing according to the embodiment of the present invention.
Figure 18:
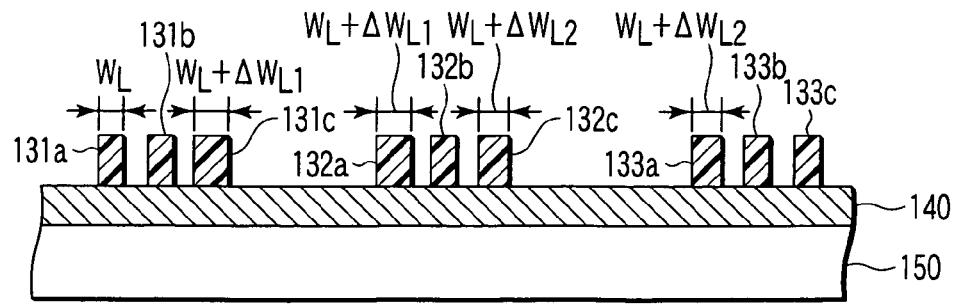
FIG. 18 is a cross sectional view of the film of FIG. 17 taken along the line 18-18 thereof for the sake of the explanation of the dimensional correction processing according to the embodiment of the present invention.
Figure 19:
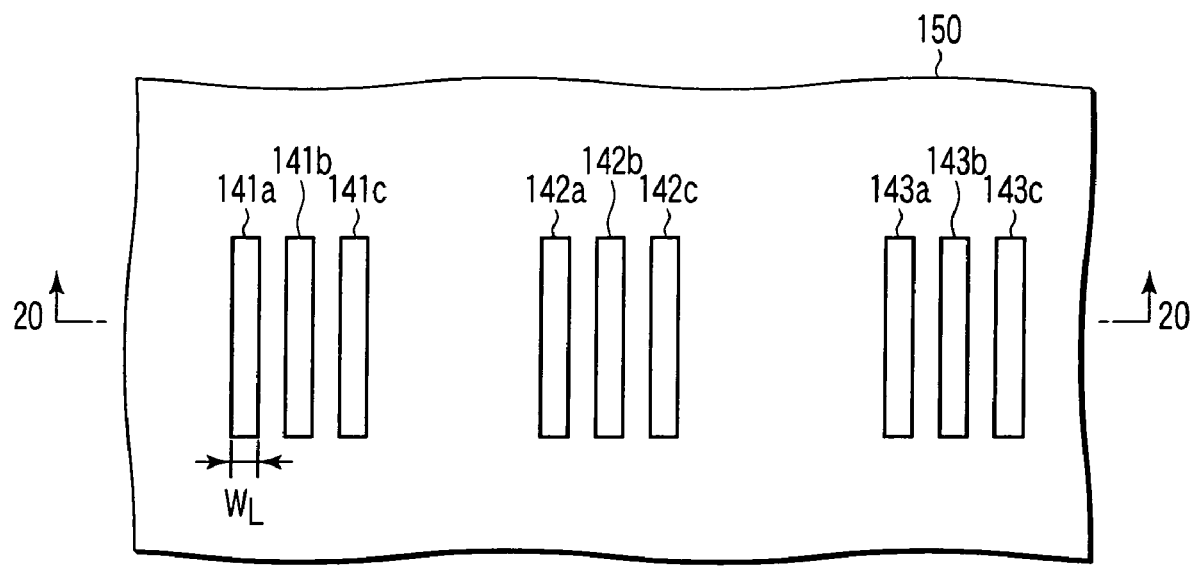
FIG. 19 is a plan view showing the film in a processing step for the sake of the explanation of the dimensional correction processing according to the embodiment of the present invention.
Figure 20:
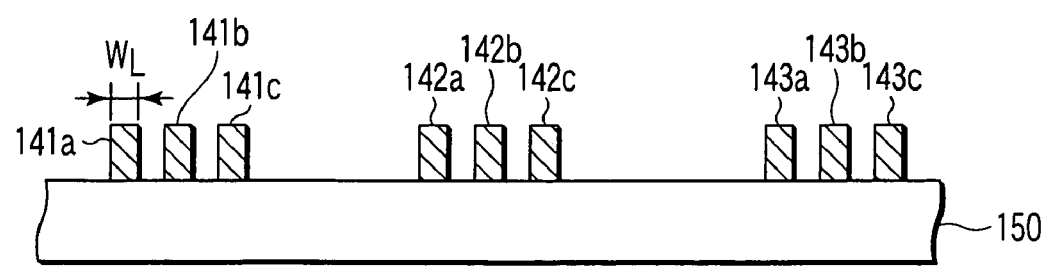
FIG. 20 is a cross sectional view of the film of FIG. 19 taken along the line 20-20 thereof for the sake of the explanation of the dimensional correction processing according to the embodiment of the present invention.

When the writing data is produced based on the correction data shown in FIG. 16 and the electron beam exposure is then performed based on the produced writing data, the resist patterns 131a, 131b, 131c, 132a, 132b, 132c, 133a, 133b, and 133c are formed as shown in FIGS. 17 and 18. A dimension $W_L + \Delta W_{L1}$ of each of the resist patterns 131c and 132a and a dimension $W_L + \Delta W_{L2}$ of each of the resist patterns 132c and 133a are larger than the dimension $W_L$. When the etching is then performed, there are formed the wiring patterns 141a, 141b, 141c, 142a, 142b, 142c, 143a, 143b, and 143c each having a desired dimension $W_L$ owing to an influence of a pattern conversion difference, as shown in FIGS. 19 and 20.

The collective shot processing section 102 of the CPU 1 performs collective shot processing of the designed patterns to collectively expose a plurality of opening patterns. Here, an example will be described in which the collective shot processing is performed with respect to designed patterns 61a to 61e of design data shown in FIG. 21. The designed patterns 61a to 61e are arranged in parallel in the X-direction. A length $L_2$ of the designed pattern 61e is twice a length $L_1$ of each of the designed patterns 61a to 61d. In a case where the designed patterns 61a to 61e are divided into rectangular patterns each having a maximum beam size or less and written by a usual VSB system, six shots in total are necessary.

Figure 21:
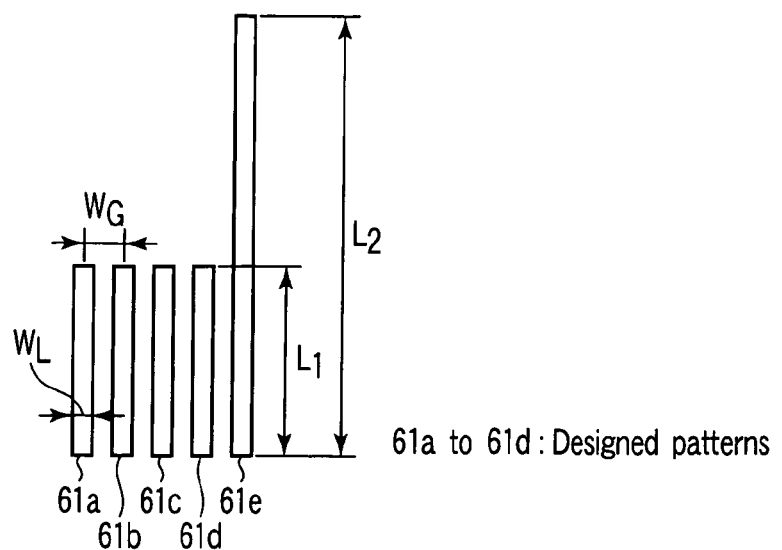
FIG. 21 is a schematic diagram of a design data for the sake of the explanation of a collective shot processing according to the embodiment of the present invention.
Figure 22:
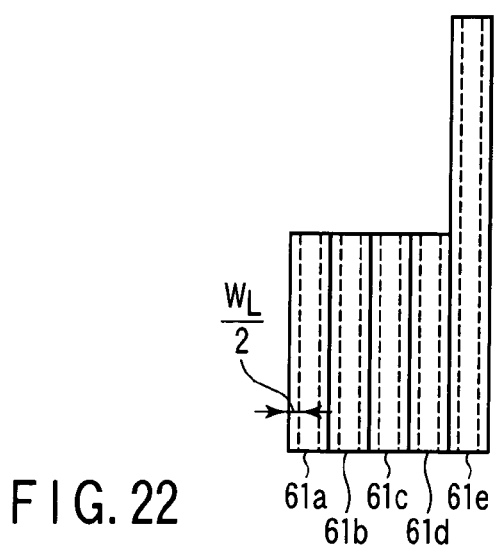
FIG. 22 is a schematic diagram of a processed design data of FIG. 21 for the sake of the explanation of the collective shot processing according to the embodiment of the present invention.

(a) The designed patterns 61a to 61e shown in FIG. 21 are widened as shown in FIG. 22. That is, a side of each of the designed patterns 61a to 61e which is parallel to a length direction, in other words, a side facing the other pattern of the designed patterns 61a to 61e is outwardly moved as shown in FIG. 22. Since there is a relation of $W_G = W_L \times 2$ between a width of each grid and that of the wiring pattern, a movement amount of each side is set to $W_L/2$, that is, ½ of a minimum distance between the patterns. In consequence, the moved sides of the respective designed patterns 61a to 61e provided on the adjacent grids come into contact with each other.

Figure 23:
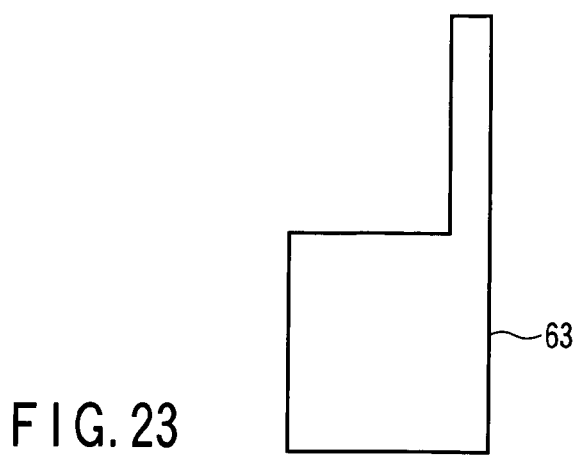
FIG. 23 is a schematic diagram of a processed design data of FIG. 22 for the sake of the explanation of the collective shot processing according to the embodiment of the present invention.

(b) Next, overlaps between the sides of the designed patterns 61a to 61e are removed to merge the patterns as shown in FIG. 23, whereby a polygonal pattern 63 is produced. The fact that the polygonal pattern 63 is produced means that the designed patterns are present on the adjacent grids and that the designed patterns are L/S patterns each having a ratio of 1:1.

Figure 24:
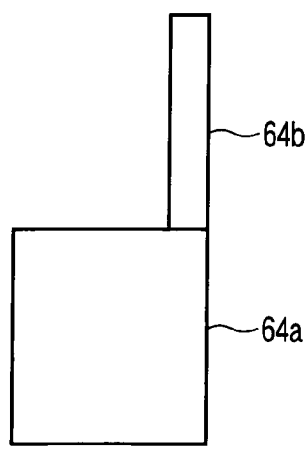
FIG. 24 is a schematic diagram of a processed design data of FIG. 23 for the sake of the explanation of the collective shot processing according to the embodiment of the present invention.
Figure 25:
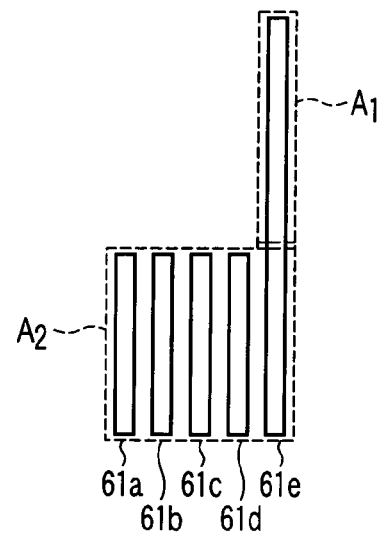
FIG. 25 is a schematic diagram of a processed design data of FIG. 24 for the sake of the explanation of the collective shot processing according to the embodiment of the present invention.
Figure 26:
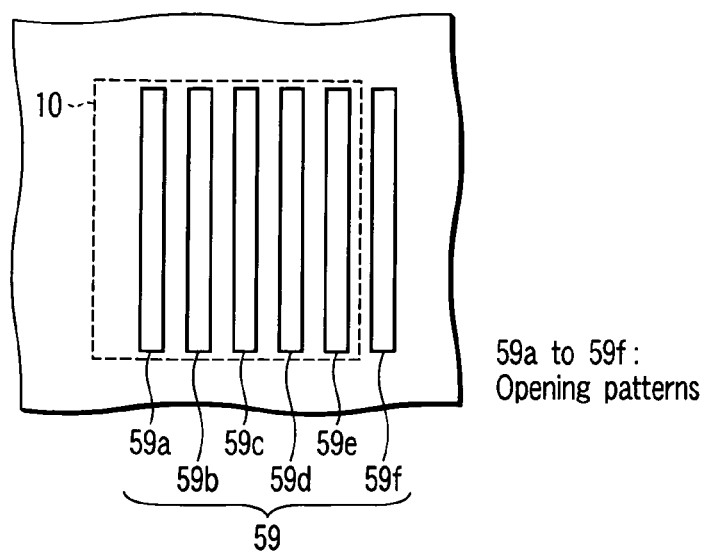
FIG. 26 is a plan view of a CP aperture mask for the sake of the explanation of the collective shot processing according to the embodiment of the present invention.

(c) The polygonal pattern 63 is divided into a plurality of rectangular patterns, in this embodiment two rectangular patterns 64a and 64b, as shown in FIG. 24 so that the pattern has the maximum beam size or less. The rectangular patterns 64a and 64b denote a size of the electron beam which is applied to the character apertures each having an L/S shape of 1:1. That is, the designed patterns 61a to 61e are divided into two shot regions $A_1$ and $A_2$ as shown in FIG. 25. In a case where there is used a character aperture 59 which corresponds to the rectangular patterns 64a and 64b shown in FIG. 24 and which has opening patterns 59a to 59f each having the LS/shape of 1:1 as shown in FIG. 26, the shot regions $A_1$ and $A_2$ can be exposed with two shots in total. An exposure position of the electron beam 10 on the CP aperture mask 59 is determined based on the widths and lengths of the shot regions $A_1$ and $A_2$ in the same manner as in the conventional VSB system. Exposure positions of the electron beam 10 formed by the character aperture 59 on the object 27 are positions themselves of the shot regions $A_1$ and $A_2$.

As described above, according to the collective shot processing, the electron beam 10 is partially applied to the character aperture having the L/S shape of 1:1, whereby a plurality of wiring patterns can collectively be written. In the case of the writing by the conventional VSB system, the designed patterns are divided into six shots, however in this embodiment, the designed patterns can be divided into two shots.

Figure 27:
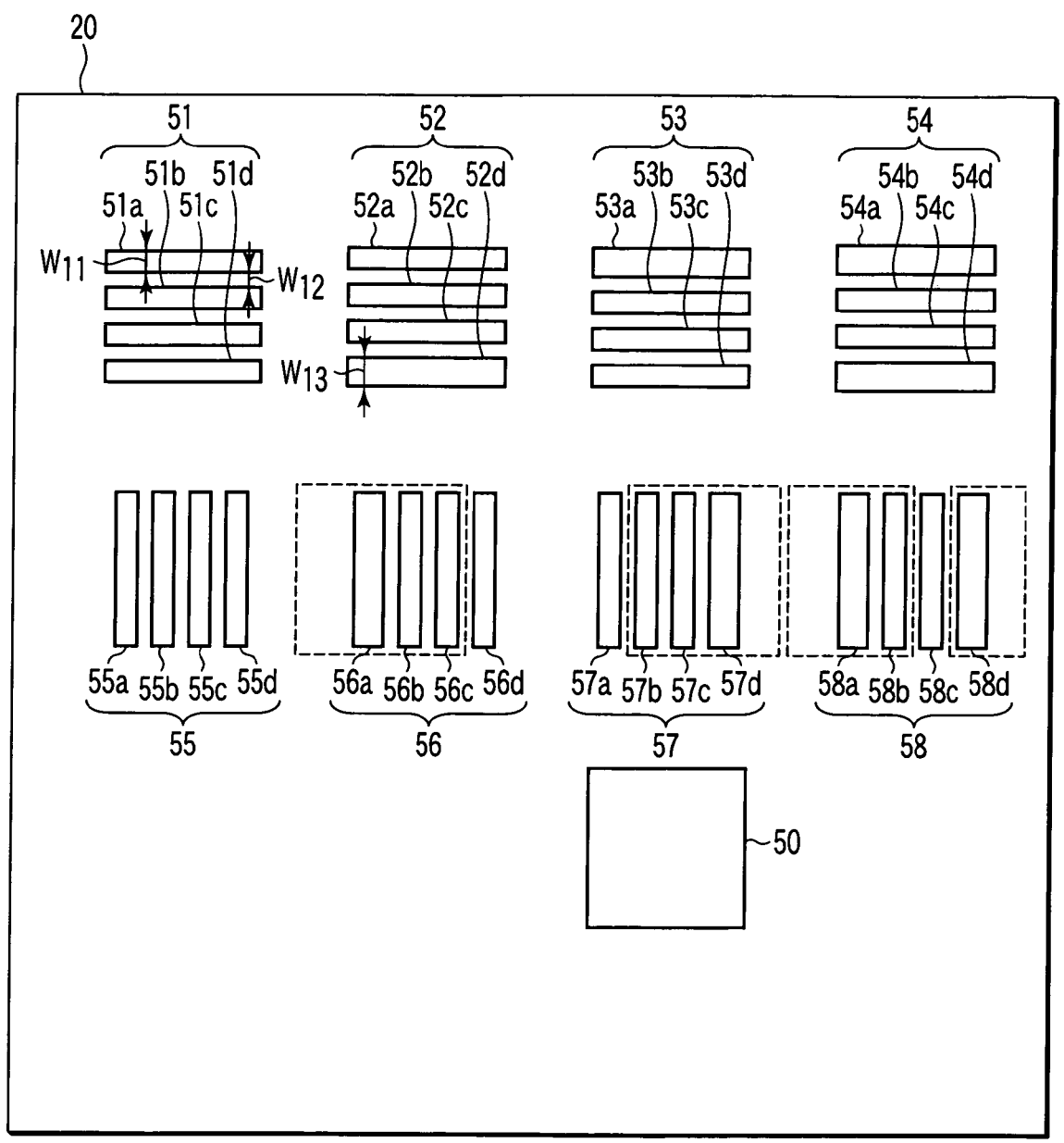
FIG. 27 is a plan view of a CP aperture mask for the sake of the explanation of a CP allocation according to the embodiment of the present invention.

In the electron beam exposure device shown in FIG. 1, the writing data generating section 103 performs a data conversion processing which converts the design data into writing data for the electron beam exposure, thereby producing the writing data. For example, when there are the designed patterns 121a, 121b, 121c, 122a, 122b, 122c, 123a, 123b, and 123c as shown in FIG. 9, these patterns are subjected to the dimensional correction processing as shown in FIG. 16 by pre-processing. The writing data generating section 103 accesses a CP data storage section 42 of the data storage unit 4 in which various character aperture data and opening pattern data are stored, to judge whether or not the designed patterns 121a, 121b, 121c, 122a, 122b, 122c, 123a, 123b, and 123c subjected to the dimensional correction processing can be exposed by using any of the character apertures 51 to 58 (FIG. 27). If there is a character aperture which matches the wiring pattern subjected to the dimensional correction processing, the character aperture can be extracted as a usable character aperture. As shown in FIG. 27, when the CP aperture mask 20 is used, it is judged that the designed patterns 121a, 121b, 121c, 122a, 122b, 122c, 123a, 123b, and 123c subjected to the dimensional correction processing can be exposed through the character apertures 56, 57, and 58 of the character apertures 51 to 58 provided on the CP aperture mask 20, and the character apertures 56, 57, 58 are extracted.

Figure 28:
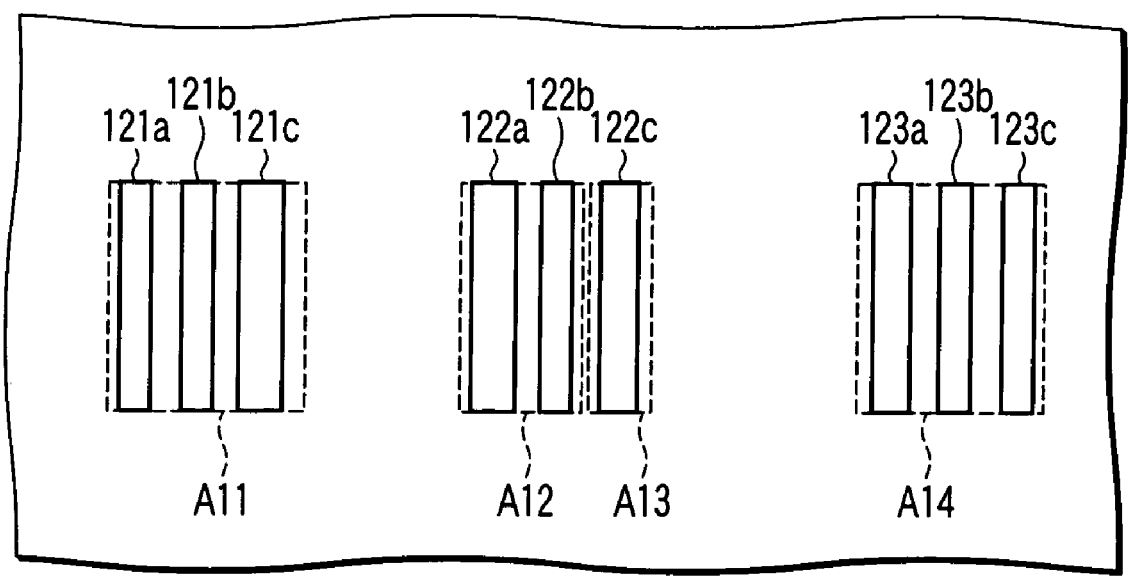
FIG. 28 is a schematic diagram of a design data after a dimensional correction processing for the sake of the explanation of the CP allocation according to the embodiment of the present invention.
Figure 29:
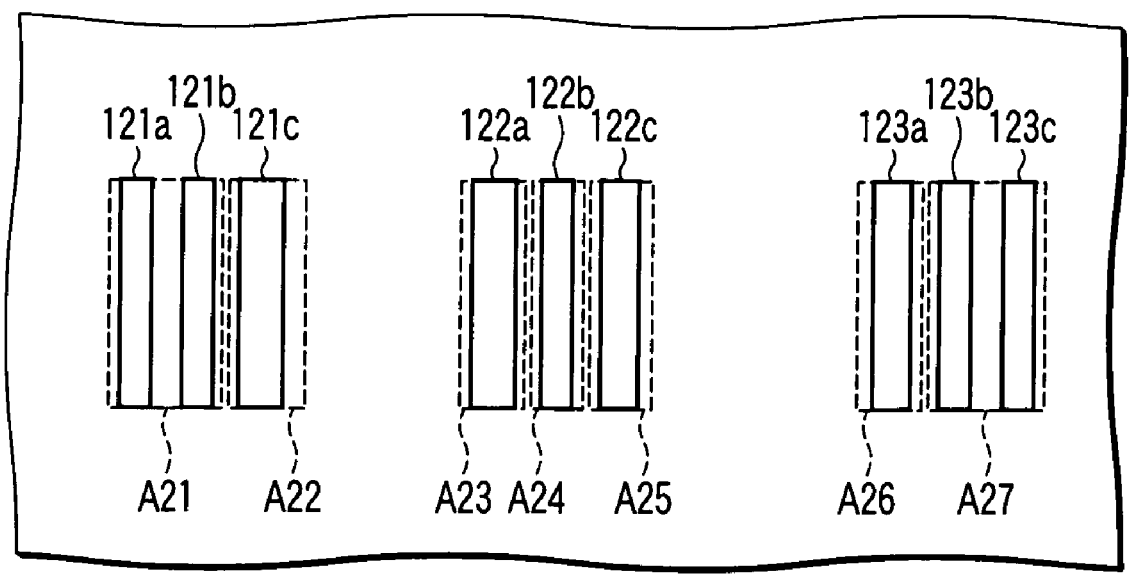
FIG. 29 is a schematic diagram of a design data after a dimensional correction processing for the sake of the explanation of a CP allocation in a conventional method.

In this case, the opening patterns 57b, 57c, and 57d of the character aperture 57 are allocated to the designed patterns 121a, 121b, and 121c shown in FIG. 28. To the designed patterns 122a, 122b, the opening patterns 58a, 58b of the character aperture 58 are allocated. To the designed pattern 121c, the opening pattern 58d of the character aperture 58 is allocated. To the designed patterns 123a, 123b, and 123c, the opening patterns 56a, 56b, and 56c of the character aperture 56 are allocated. That is, shot regions $A_{11}$ to $A_{14}$ can be exposed with four shots. If there is a portion where collective shooting cannot be performed, the exposure may be performed by using the opening 50 for VSB (FIG. 27) provided on the CP aperture mask 20. In the data conversion processing, character apertures and opening patterns respectively allocated to the individual shot regions $A_{11}$ to $A_{14}$ are described to produce writing data. The writing data is stored in a writing data storage section 43 of the data storage unit 4. In a conventional method, as shown in FIG. 29, the shot region is divided into seven shot regions $A_{21}$ to $A_{27}$, and exposure of seven shots is necessary. On the other hand, in this embodiment, the shot region is divided into four of shot regions $A_{11}$ to $A_{14}$, and the exposure can be performed with four shots.

The CP selection circuit 33 of the writing control unit 3 refers to CP data in the writing data to select the character aperture to be used. For example, in a case where the character aperture 51 is selected, the CP selection circuit 33 sends a control signal to a CP amplifier, not shown, to control the CP selecting deflectors 19a to 19d at an appropriate voltage, so that the character aperture 51 is selected. In consequence, the collective shot processing can be performed even in a case where the pattern dimensions are corrected by the preprocessing as in the above-described example.

As the input device 5, there can be used, for example, a keyboard, a mouse, a recognition device such as an OCR, a graphic input device such as an image scanner, or a special input device such as a voice input device. As the output device 6, there can be used a display device such as a liquid crystal display or a CRT display, or a printing device such as an ink jet printer or a laser printer. The main storage unit 7 functions as a temporary data memory or the like in which data or the like to be utilized during program execution processing in the CPU 1 is temporarily stored and which is utilized as a work area. As the main storage unit 7, there can be employed, for example, a semiconductor memory, a magnetic disk, an optical disk, a magnetic optical disk, a magnetic tape or the like.

The CPU 1 further comprises an input/output control unit (interface), an exposure control section and storage unit management means, which are not shown. The input/output control unit (interface) controls input/output of signals among the CPU 1, the writing control unit 3, the input device 5 and the output device 6. The exposure control section reads the writing data from the writing data storage section 43 to control the writing by use of the electron beam 10 in the writing unit 2. The storage unit management means manages input/output of the data storage unit 4, the main storage unit 7 and the program storage unit 8.

The data storage unit 4 includes the design data storage section 41 which stores desired design data of an LSI, the CP data storage section 42 which stores information of the opening patterns and the CP apertures, and the writing data storage section 43 which stores the writing data. All data required for the writing is stored in the data storage unit 4.

An example of an electron beam exposure method of the CP system in this embodiment will be described with reference to a flow chart of FIG. 30.

(a) In a step S10, as shown in FIG. 8, in the CP aperture mask 20, there are prepared a plurality of apertures including the character apertures 51 and 55 each having high repeatability, and the character apertures 52 to 54 and 56 to 58 formed by changing dimensions of graphics included in outer peripheral portions of the character apertures 51 and 55, respectively.

(b) In a step S11, the correcting section 101 reads the design data from the design data storage section 41. The correcting section 101 corrects the dimensions of the designed patterns of the design data in consideration of at least one of parameters such as a forward scattering distance of the electrons of the beam, a rearward scattering distance of the electrons of the beam, a blurring of the electron beam, a distance by which the underlayer provided under the chemical amplification resist is influenced by a diffusion of an acid in the resist to be exposed to the electron beam, and a dimension conversion difference of the designed patterns due to a denseness/coarseness difference of the designed patterns caused when the underlayer is processed while using the resist as a mask.

(c) In a step S12, the collective shot processing section 102 performs the collective shot processing, and divides the designed pattern so as to have a dimension that is not more than the beam size.

(d) In a step S13, the writing data generating section 103 judges whether or not the designed pattern subjected to the dimensional correction processing can be exposed by using at least a part of the plurality of character apertures 51 to 58. If the exposure is possible, the shot region is allocated to the corresponding specific character aperture, and the designed pattern is divided into the shot regions. The opening 50 for VSB is allocated to a remaining portion which cannot be exposed by using the character apertures 51 to 58.

(e) In a step S14, it is described for each shot region that each shot region uses any of the character apertures 51 to 58 or uses the opening 50 for VSB, whereby the writing data is produced. The writing data is stored in the writing data storage section 43.

(f) In a step S15, the CP selection circuit 33 refers to the CP data in the writing data to select the character apertures 51 to 58 or the opening 50 for VSB, and exposes the object 27 with the electron beam 10 passed through the selected character apertures 51 to 58 or the opening 50 for VSB. At this time, it becomes possible to collectively expose the wiring patterns having different pattern dimensions.

According to the embodiment of the present invention, the dimension is corrected in consideration of influences such as a forward scattering distance of electrons, a rearward scattering distance of electrons, a blurring of the electron beam, a distance by which the underlayer provided under the chemical amplification resist is influenced by a diffusion of an acid in the resist to be exposed to the electron beam, and a dimension conversion difference of the designed patterns due to a denseness/coarseness difference of the designed patterns caused when the underlayer is processed while using the resist as a mask. Therefore, as compared with the conventional method, high-precision writing is possible.

By the way, when a plurality of opening patterns are prepared for various conditions to correct a dimension for the compensation of the dimensional conversion difference, the number of the opening patterns for correcting the dimension for the compensation of the dimensional conversion difference increases. In consequence, much of originally necessary opening patterns cannot be provided on the CP aperture mask. Moreover, when the opening pattern is divided to individually exposure the divided patterns, it is not necessary to produce the opening patterns for the various conditions, however a throughput lowers in relation to the trade-off. In this embodiment, even when the dimension of the designed pattern is corrected by the dimensional correction processing, it is possible to collectively shoot the plurality of designed patterns having different dimensions by use of the character apertures 51 to 58. Therefore, as compared with the conventional case, the number of the shots can be reduced without deteriorating a writing precision. As a result, in the electron beam exposure of the CP system, the throughput can be enhanced.

Figure 30:
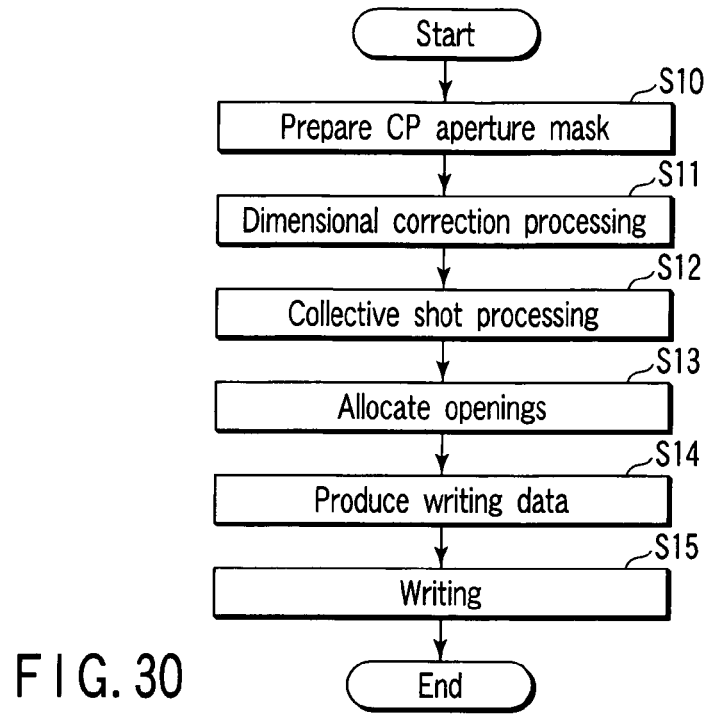
FIG. 30 is a flow chart for the sake of the explanation of an example of an electron beam exposure method according to the embodiment of the present invention.

A series of procedures shown in FIG. 30 can be executed in accordance with a program of an algorithm equivalent to that of FIG. 30 by controlling the electron beam exposure device shown in FIG. 1. This program may be stored in the program storage unit 8 of a computer system constituting the electron beam exposure device of this embodiment. Furthermore, this program is stored in a computer-readable recording medium, and the program storage unit 8 of the electron beam exposure device is allowed to read the program of this recording medium, whereby a series of procedures of the present invention can be executed.

Here, the computer-readable recording medium means a medium such as an external memory unit of a computer, a semiconductor memory, a magnetic disk, an optical disk, a magnetic optical disk or a magnetic tape in which a program can be recorded. Specifically, the computer-readable recording medium includes a flexible disk, a CD-ROM, an MO disk, and the like. For example, a main body of the electron beam exposure device may be constituted so that a flexible disk drive and an optical disk drive are built-in or connected to the outside. The flexible disk is inserted into the flexible disk drive or the CD-ROM is inserted into the optical disk drive through an insertion port of the drive, and a predetermined read operation is performed, whereby the program stored in the recording medium can be installed in the program storage unit 8 constituting the electron beam exposure device. When a predetermined drive unit is connected, for example, the ROM or the magnetic tape unit can be used. Furthermore, this program can be stored in the program storage unit 8 via a communication network such as an Internet.

Figure 31:
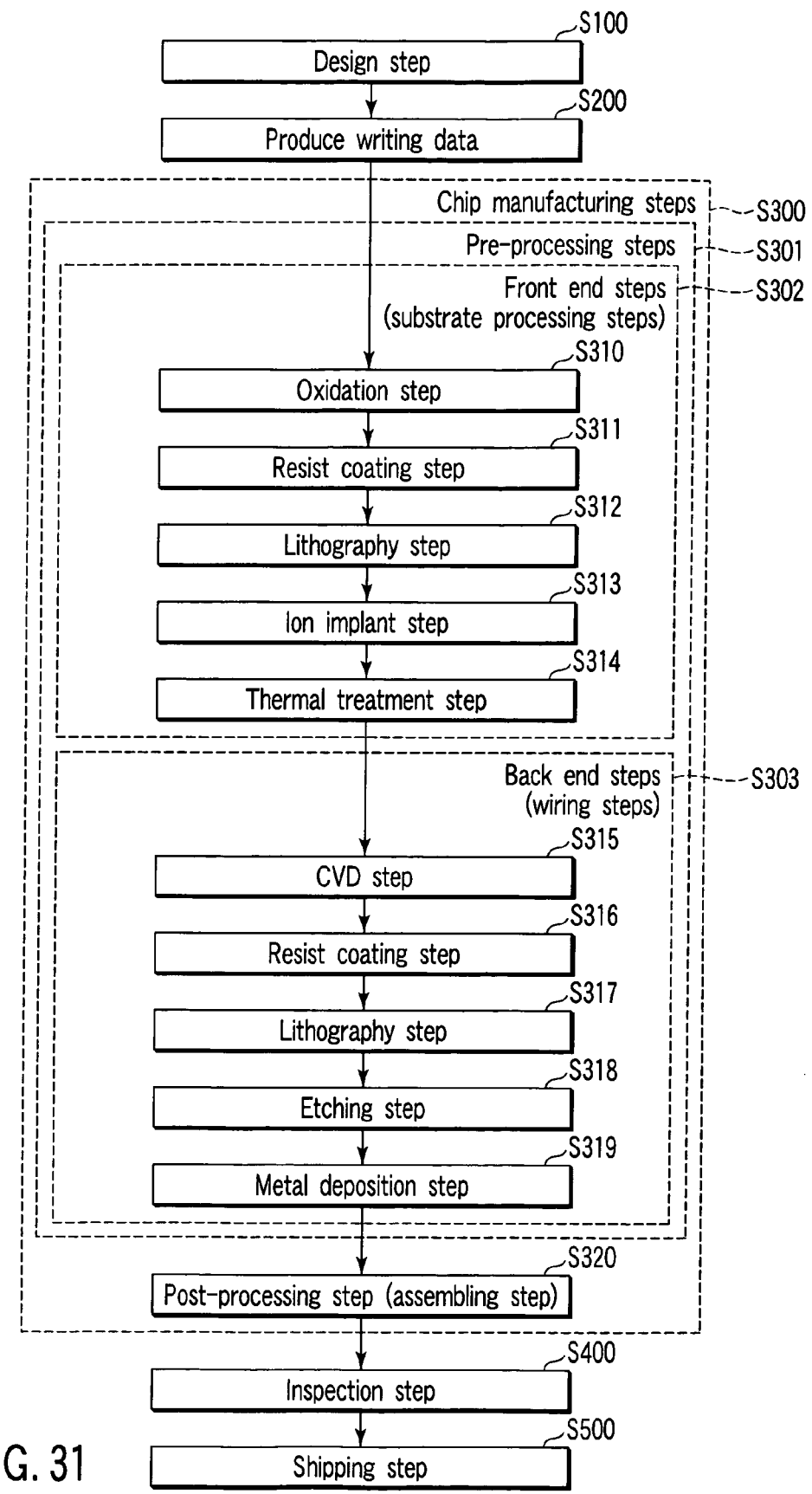
FIG. 31 is a flow chart for the sake of the explanation of an example of a manufacturing method of a semiconductor device according to the embodiment of the present invention.

A manufacturing method of a semiconductor device (LSI) using the electron beam exposure device shown in FIG. 1 will be described with reference to FIG. 31. It is to be noted that the following manufacturing method of the semiconductor device is an example, and needless to say, the present invention can be realized by various manufacturing methods other than this example.

(a) In a step S100, process simulation, lithography simulation, device simulation and circuit simulation are performed to produce layout data (design data).

(b) In a step S200, the design data is subjected to dimensional correction processing, collective shot processing and data conversion processing by the same procedures as in the steps S10 to S14 shown in FIG. 30 to produce the writing data for direct writing.

(c) In front end steps (substrate steps) of a step S302, there are repeatedly performed in a predetermined order an oxidation step S310, a resist coating step S311, a lithography step S312 by a direct writing system, an ion implant step S313, a thermal treatment step S314, and the like in combination with a chemical vapor development (CVD) step and an etching step (not shown). FIG. 31 illustrates a part of the front end steps. Since this is the only illustration, the thermal treatment step S314 may be omitted or the ion implant step may be performed after an etching step. For example, in the step S311, a semiconductor wafer is coated with a photosensitive film (resist film). In the step S312, an image of the character apertures 51 to 58 or the opening 50 for VSB as an target of the direct writing system is written on the resist film by use of the electron beam exposure device shown in FIG. 1 in accordance with a procedure similar to the step S15 of FIG. 30. Subsequently, the image on the resist film is developed to prepare an etching mask. In the step S313, ions are selectively implanted into the semiconductor wafer by use of the prepared etching mask. In the step S314, a thermal treatment is performed to activate the implanted ions. It is to be noted that all the lithography steps of the front end steps S302 do not have to be performed by the direct writing system. For example, the direct writing system may be employed in an only step that requires fine processing as in preparation of the etching mask for etching of a gate electrode of an MOSFET.

(d) When a series of steps S302 end, the process advances to back end steps (wiring steps) S303. In the steps S303, the surface of the substrate is subjected to wiring line formation processing. In the back end steps, there are repeatedly performed a CVD step S315 to an interlayer insulating film, a resist coating step S316 onto the interlayer insulating film, a lithography step S317 by the direct writing system, an etching step S318 of a contact hole and a via-hole in the interlayer insulating film, a metal deposition step S319, and the like. After the metal deposition step S319, a metal film is pattered in another lithography step and the subsequent etching step, which are not shown. To form a damascene groove, after the etching step S318, a lithography step and the subsequent etching step are performed to form the damascene groove. Subsequently, the metal deposition step S319 is performed, and then the metal film is patterned by a CMP step. In the lithography step S317, in the same manner as in the step S312, a pattern of the character apertures 51 to 58 or the opening 50 for VSB as an object is written on the resist formed on the semiconductor wafer with the direct writing system by use of the electron beam exposure device shown in FIG. 1 in accordance with a procedure similar to that of the step S15 of FIG. 30. Subsequently, the resist is developed to form an etching mask of the resist. After a series of steps end, the process advances to a step S320. It is to be noted that in the same manner as in the front end steps S302, all the lithography steps do not have to be performed by the direct writing system, and the direct writing system may be employed in a specific step of making the contact hole or the like, however this does not prevent the direct writing system from being applied to all the lithography steps.

(e) When a multilayer wiring structure is formed and pre-steps S301 are completed, in the step S320, the semiconductor wafer is divided into a plurality of chips each having a predetermined size. The chips are mounted on a packaging, and further there is performed a package assembling step such as a step of connecting electrode pads on the chips to lead wires of a lead frame. A semiconductor device is completed via inspection of the semiconductor device in a step S400. Subsequently, the device is shipped in step S500.

As described above, according to the manufacturing method of the semiconductor device of this embodiment, in the lithography steps S312, S317, it can be judged whether or not the aperture mask needs to be changed without lowering a device operation ratio and without increasing costs. Therefore, a yield decrease is avoided, production costs are reduced, and mass production is possible in a short time.

It is to be noted that the electron beam exposure device shown in FIG. 1 may be used in preparation of a mask for exposure. In this case, the dimensional correction processing, the collective shot processing and the data conversion processing are performed in accordance with the same procedure as in the steps S10 to S14 shown in FIG. 30 by use of a CAD system based on a surface pattern such as a layout designed in the design step S10, whereby pattern data (writing mask data) of the mask are produced as a plurality of sets corresponding to the layers formed on the semiconductor chip. By use of the electron beam exposure device (pattern generator) shown in FIG. 1, the writing is performed in accordance with the procedure of the step S15 shown in FIG. 30, and the exposure masks of the layers are prepared on a mask substrate of quartz glass or the like, whereby the sets of the masks are prepared. Subsequently, in the lithography steps illustrated in the steps S312, S317 or the like, a device pattern of the exposure mask for the corresponding layer is exposed on a photosensitive film on the semiconductor wafer by use of an exposure unit such as a stepper. Subsequently, patterning is performed to prepare an ion implanting mask, an etching mask, or the like, and the front end steps partially illustrated in the steps S302 and the back end steps partially illustrated in the steps S303 are performed. Needless to say, the exposure by the above-described stepper or the like may be combined with the direct writing system.

First Modification

Figure 32:
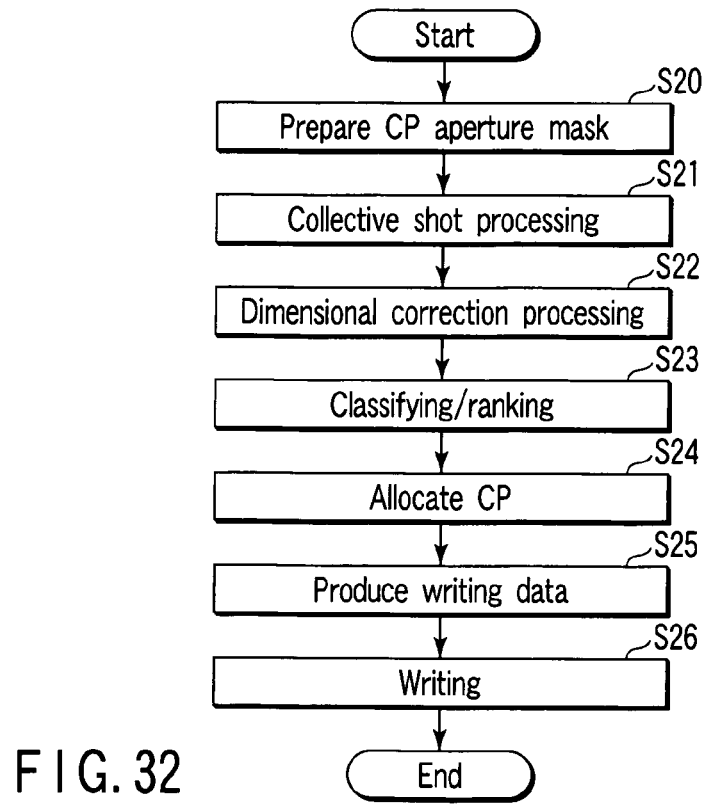
FIG. 32 is a flow chart for the sake of the explanation of an example of an electron beam exposure method in a first modification of the embodiment of the present invention.

In a first modification of this embodiment, another example of an electron beam exposure method will be described with reference to a data production flow shown in FIG. 32.

Figure 33:
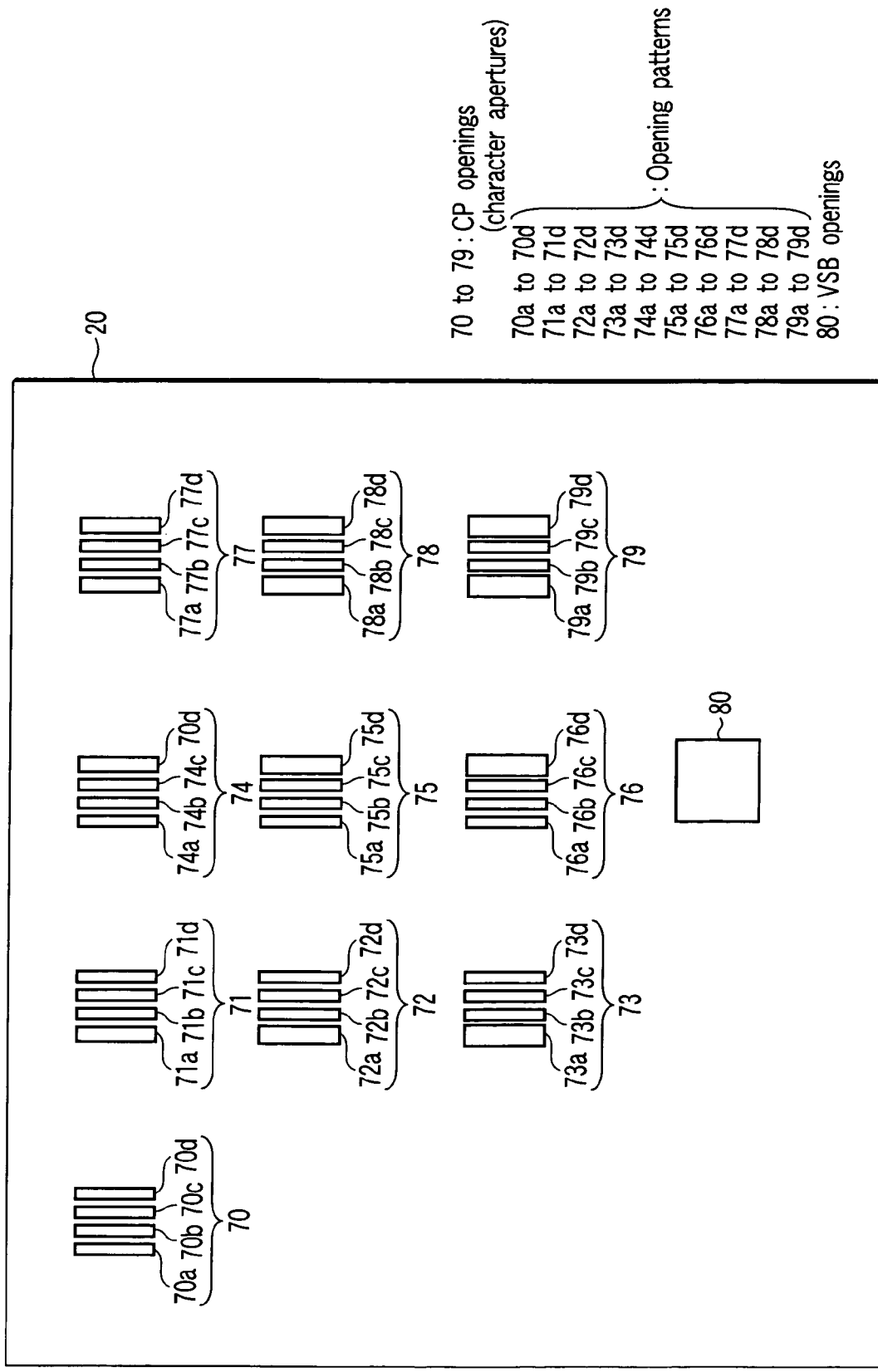
FIG. 33 is a plan view for the sake of the explanation of a CP aperture mask in the first modification of the embodiment of the present invention.

(a) In a step S20, a CP aperture mask 20x shown in FIG. 33 is prepared. In the CP aperture mask 20x, there are arranged a character aperture 70 having opening patterns 70a to 70d all formed into an equal dimension, an opening 80 for VSB, character apertures 71, 72, and 73 having left opening patterns 71a, 72a, and 73a which are differently widened among the opening patterns, apertures 74, 75, and 76 having right opening patterns 74d, 75d, and 76d which are differently widened among the opening patterns, and character apertures 77, 78, and 79 in which opposite end opening patterns 77a, 77d, 78a, 78d, 79a, and 79d are differently widened among the opening patterns. The widened portion amount of each of the opening patterns 72a, 75d, 78a, and 78d is larger than that of each of the opening patterns 71a, 74d, 77a, and 77d, and the widened portion amount of each of the opening patterns 73a, 76d, 79a, and 79d is larger than that of each of the opening patterns 72a, 75d, 78a, 78d. The widened portion amounts correspond to the pattern correction amounts shown in FIG. 15. When designed patterns are arranged on fixed grids, each of the widened portion amounts may be integer times each fixed grid.

(b) In a step S21, the collective shot processing section 102 of the CPU 1 (FIG. 1) performs the collective shot processing with respect to design data (FIG. 9) read from the design data storage section 41 of the data storage unit 4 (FIG. 1). As a result, as shown in FIG. 34, the designed patterns 121a, 121b, 121c, 122a, 122b, 122c, 123a, 123b, and 123c are divided into shot regions $A_{31}$, $A_{32}$, and $A_{33}$ each having a maximum beam size or less.

(c) In a step S22, the correcting section 101 of the CPU 1 calculates a distance $W_{S2}$ between the adjacent shot regions $A_{31}$ and $A_{32}$ and a distance $W_{S3}$ between the adjacent shot regions $A_{32}$ and $A_{33}$. For example, the distance $W_{S2}$ is calculated as 300 nm, and the distance $W_{S3}$ is calculated as 200 nm. Furthermore, in accordance with the distances $W_{S2}$ and $W_{S3}$ and by use of the correction table shown in FIG. 15, the correcting section 101 corrects (resizes) the designed patterns 121c and 122a and the designed patterns 122c and 123a to widen the designed patterns 121c and 122a and the designed patterns 122c and 123a by dimensions $\Delta W_{L1}$ and $\Delta W_{L2}$, respectively, so that the designed patterns 121c and 122a and the designed patterns 122c and 123a have dimensions $W_L+\Delta W_{L1}$ and $W_L+\Delta W_{L2}$, respectively, as shown in FIG. 35.

(d) In a step S23, the writing data producing section 103 (FIG. 1) of the CPU 1 classifies all the shot regions $A_{31}$, $A_{32}$ and $A_{33}$ into types (the right side pattern is wide, the left side pattern is wide, the opposite side patterns are wide, the patterns are normal width, VSB), and ranks the distances. For example, with regard to the shot region $A_{31}$, the classified type is "the right side pattern is wide" and the ranked distance is 300 nm. In a step S24, on the basis of the types and the distance ranks of the shot regions $A_{31}$, $A_{32}$, and $A_{33}$, the corresponding opening patterns are selected from the opening patterns stored in the CP data storage section 42. In the CP data storage section 42, the opening patterns provided on the CP aperture mask 20x to be used are classified and stored in accordance with the types and the distance ranks. The shot region $A_{31}$ has the designed patterns in which the only right side pattern 121c is wide, and the correction amount corresponds to 300 nm. Therefore, opening patterns 75b, 75c, and 75d of the character aperture 70 of the CP aperture mask 20x (FIG. 33) are allocated to the shot region $A_{31}$. For the other shot regions, the opening patterns are similarly selected. For example, in the shot region $A_{32}$, to the left side pattern 122a, an opening pattern which is wider by an amount corresponding to the correction amount of 300 nm is allocated, and to the right side pattern 122c, an opening pattern which is wider by an amount corresponding to the correction amount of 200 nm is allocated. When there is no corresponding opening pattern, as shown in FIG. 36, the shot region $A_{32}$ is further divided into two shot regions $A_{34}$ and $A_{35}$, and opening patterns 72a and 72b and the opening pattern 77a may be used, respectively. A portion which cannot collectively be shot may be exposed using the opening 80 for VSB. The designed patterns 121a, 121b, 121c, 122a, 122b, 122c, 123a, 123b, and 123c shown in FIG. 35 are collectively shot with seven shots in a conventional method, on the other hand, in this embodiment, the above designed patterns can be exposed with three shots as shown in FIG. 36.

(e) In a step S25, the writing data producing section 103 of the CPU 1 (FIG. 1) describes, for each shot region, the character apertures and the opening for VSB to be used in the individual shot regions to produce the writing data. The writing data is stored in the writing data storage section 43. In a step S26, the writing data is read from the writing data storage section 43 to perform electron beam exposure.

According to the present first modification, even in a case where the dimensional correction processing is performed in the step S22 after the collective shot processing is performed in the step S21, the number of the shots can be reduced without deteriorating the writing precision, as compared with the conventional method. As a result, in the electron beam exposure of the CP system, the throughput can be enhanced.

Second Modification

Figure 37:
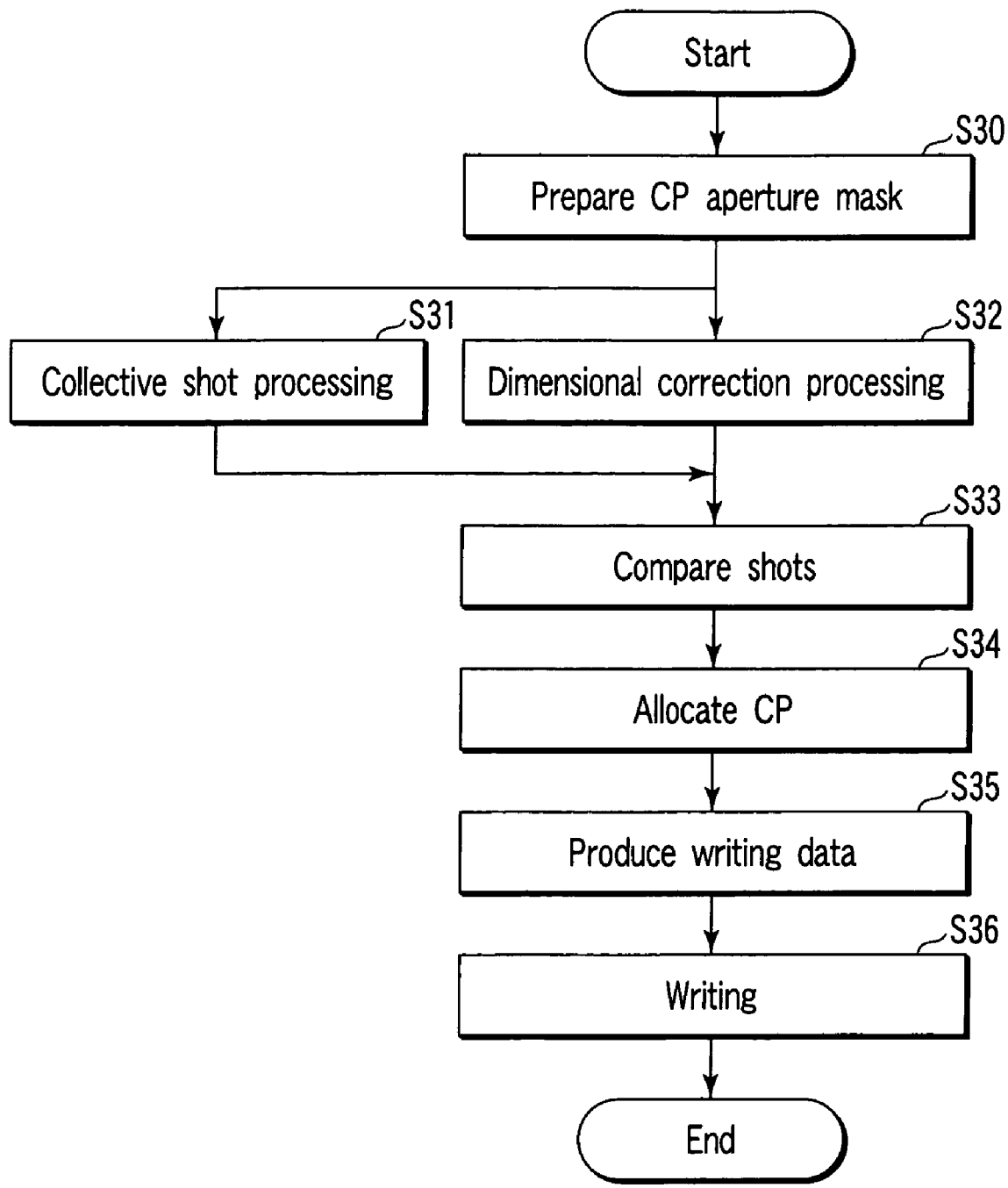
FIG. 37 is a flow chart for the sake of the explanation of an example of an electron beam exposure method in a second modification of the embodiment of the present invention.

In a second modification of this embodiment, another example of an electron beam exposure method will be described with reference to a data production flow shown in FIG. 37.

(a) In a step S30, a CP aperture mask is prepared. In a step S31, the collective shot processing section 102 of the CPU 1 (FIG. 1) performs the collective shot processing with respect to desired LSI design data read from the design data storage section 41. As a result, as shown in, for example, FIG. 38, designed patterns 151a, 151b, 151c, 151d, and 151e are divided into two shot regions $A_{41}$ and $A_{42}$.

(b) In a step S32, the correcting section 101 of the CPU 1 performs the dimensional correction processing with respect to the desired LSI design data read from the design data storage section 41. As a result, the designed pattern 151d having a dimension $W_L$ is widened by a dimension $\Delta W_L$ so that the designed pattern 151d has a dimension $W_L+\Delta W_L$.

(c) In a step S33, the writing data producing section 103 of the CPU 1 performs a logic operation to compare the designed patterns 151a, 151b, 151c, 151d, and 151e in the shot region $A_{41}$ subjected to the collective shot processing of the step S31 with the designed patterns 151a, 151b, 151c, 151d, and 151e subjected to the dimensional correction processing of the step S32. When differences are found between the designed patterns 151a, 151b, 151c, 151d, and 151e before the dimensional correction processing and those after the dimensional correction processing, in the example of FIG. 32, the type of the difference is obtained, the dimension of the lower designed pattern 151d is corrected, and further a line width (distance rank) $W_L+\Delta W_L$ of the pattern is calculated.

(d) In a step S34, on the basis of the type and the distance rank obtained in the step S33, an optimum opening pattern is selected from the opening patterns provided on the CP aperture mask 20 (FIG. 38). This is performed with respect to all of the shot regions $A_{41}$ and $A_{42}$, whereby it is possible to allocate the opening patterns based on the types and the distance ranks of the patterns. In a portion which cannot collectively be shot, an opening for VSB may be used. Another portion that can collectively be shot may similarly be processed.

(e) In a step S35, the writing data producing section 103 of the CPU 1 describes, for each shot region, the character apertures and the opening for VSB to be used in the individual shot regions to produce the writing data. The writing data is stored in the writing data storage section 43.

(f) In a step S36, the writing data is read from the writing data storage section 43 to perform electron beam exposure.

According to the present second modification, as compared with the conventional case, the number of the shots can be reduced without deteriorating the writing precision. As a result, in the electron beam exposure of the CP system, the throughput can be enhanced.

It is to be noted that in the above-described embodiment of the present invention, the example has been described in which an electron beam writing method is applied to the wiring pattern, but an object to be written with the electron beam is not limited to the wiring pattern. For example, when a plurality of corresponding character apertures are similarly prepared even with respect to patterns of a gate layer, an element region layer, and the like, electron beam writing is possible.

Moreover, in the example of the CP aperture mask 20 shown in FIG. 8, the only character apertures 52 to 54 and 55 to 58 are prepared by changing the dimensions of the outer patterns of the character apertures 51 and 54, respectively, however more character apertures may be prepared, and the opening patterns may finely be changed in the more character apertures.

Furthermore, a plurality of character apertures having different wiring pitches may be prepared. In this case, when the collective shot processing is performed, an appropriate character aperture can be selected, so that the throughput is enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam exposure method of a character projection system, comprising:

preparing an aperture mask having a plurality of character apertures;

correcting dimensions of designed patterns in design data in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;

allocating at least a part of a specified character aperture of the plurality of character apertures of the aperture mask to the corrected designed patterns to produce writing data; and exposing the resist to the beams of the charged particle passed through the at least a part of the specified character aperture based on the writing data.

2. The charged particle beam exposure method of the character projection system according to claim 1, wherein the allocation of the opening patterns comprises:

comparing the corrected designed patterns with the plurality of character apertures, respectively; and allocating the specified character aperture specified by a result of the comparison to the designed patterns.

3. The charged particle beam exposure method of the character projection system according to claim 1, wherein the allocation of the opening patterns comprises:

comparing the dimensions of the designed patterns before the correction with those after the correction to obtain dimensional correction amounts of the designed patterns; and allocating the specified character aperture specified by the dimensional correction amounts to the designed patterns.

4. The charged particle beam exposure method of the character projection system according to claim 1, wherein each of the plurality of character apertures have a plurality of opening patterns, the at least a part of the specified character aperture is at least a part of the plurality of opening patterns of the specified character aperture, and the at least a part of the plurality of opening patterns of the specified character aperture are allocated to those of the plurality of designed patterns which are in a shot region including at least a designed pattern having a dimension changed by the correction.

5. The charged particle beam exposure method of the character projection system according to claim 4, wherein the allocation of the opening patterns includes:

comparing the plurality of designed patterns in the shot region including the at least a designed pattern having the dimension changed by the correction with the plurality of character apertures, respectively, to specify the specified character apertures; and allocating the at least a part of the opening patterns of the specified character apertures to the plurality of designed patterns in the shot region including the at least a designed pattern having the dimension changed by the correction.

6. The charged particle beam exposure method of the character projection system according to claim 4, wherein the allocation of the opening patterns comprises:

comparing the dimensions of the designed patterns before the correction with those after the correction to obtain a dimensional correction amount of the at least a designed pattern having the dimension changed by the correction and to specify the specified character aperture; and allocating at least a part of the opening patterns of the specified character apertures to a plurality of designed patterns in the shot region including at least the designed patterns having the dimensions changed by the correction.

7. The charged particle beam exposure method of the character projection system according to claim 4, wherein the at least a part of the opening patterns of the specified character aperture is opening patterns corresponding to the designed patterns included in the shot region.

8. The charged particle beam exposure method of the character projection system according to claim 4, wherein the designed patterns are L/S wiring patterns of ratio of 1:1 and arranged on wiring grids.

9. The charged particle beam exposure method of the character projection system according to claim 8, wherein sides of the L/S wiring patterns which are adjacent to each other come into contact with each other by the correction to merge into one pattern.

10. The charged particle beam exposure method of the character projection system according to claim 4, wherein the shot region has a size which is not more than a maximum beam size.

11. The charged particle beam exposure method of the character projection system, according to claim 4, wherein the production of the writing data comprises:
dividing the plurality of designed patterns of the design data into a plurality of shot regions;
specifying the shot regions based on correction configurations and correction amounts of the designed patterns having dimensions changed by the correction; and
allocating the character apertures having the opening patterns corresponding to the designed patterns of the specified shot regions to the designed patterns of the specified shot regions, based on a correspondence table of the designed patterns beforehand stored in a data storage section and having the corrected dimensions and the character apertures.

12. The charged particle beam exposure method of the character projection system according to claim 4, wherein the production of the writing data comprises:
dividing the plurality of designed patterns of the design data before the correction into a plurality of shot regions; and
comparing the designed patterns having dimensions changed by the correction with the designed patterns included in the shot regions corresponding to the designed patterns having the dimensions changed by the correction to obtain correction configurations and correction amounts of the designed patterns before and after the correction, and allocating the character apertures having the opening patterns corresponding to the designed patterns included in the divided shot regions to the designed patterns included in the divided shot regions.

13. A charged particle beam exposure device of a character projection system comprising:
a stage on which a substrate is to be mounted;
a driving mechanism which drives an aperture mask having a plurality of character apertures;
a beam generation source of charged particles which applies beams of the charged particles to the substrate via the aperture mask;
a correction section which corrects dimensions of designed patterns of design data in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;
a writing data producing section which allocates at least a part of a specified character aperture of the plurality of character apertures of the aperture mask to the corrected designed patterns to produce writing data; and
an exposure section which exposes the resist to the beams of the charged particle passed through the at least a part of the specified character aperture based on the writing data.

14. A program for use in a charged particle beam exposure device on which an aperture mask having a plurality of character apertures is mounted, the program allowing a computer to execute:
an instruction to correct dimensions of designed patterns in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;
an instruction to allocate at least a part of a specified character aperture of the plurality of character apertures of the aperture mask to the corrected designed patterns to produce writing data; and
an instruction to expose the resist to the beams of the charged particle passed through the at least a part of the specified character aperture based on the writing data.

15. A manufacturing method of a semiconductor device in which a charged particle beam exposure method of a character projection system is used in manufacturing steps of the semiconductor device, the charged particle beam exposure method comprising:
preparing an aperture mask having a plurality of character apertures each having a plurality of opening patterns;
correcting dimensions of designed patterns of design data in consideration of at least one of a forward scattering distance of a charged particle, a rearward scattering distance of the charged particle, a blurring of a beam of the charged particle, a distance by which an underlayer provided under a resist is influenced by a diffusion of an acid in the resist to be exposed to the beam of the charged particle, and a dimension conversion difference of the designed patterns due to a denseness/coarseness difference of the designed patterns caused when the underlayer is processed while using the resist as a mask;
allocating at least a part of a plurality of opening patterns of a specified character aperture specified from the plurality of character apertures to those of the plurality of designed patterns which are in a shot region including at least a designed pattern having a dimension changed by the correction to produce writing data; and
exposing the resist to the beams of the charged particle passed through the at least a part of the opening patterns of the specified character aperture based on the writing data.

16. The manufacturing method of the semiconductor device according to claim 15, wherein the manufacturing step which uses the charged particle beam exposure method is a lithography step.

* * * * *